United States Patent
Yokoyama et al.

(10) Patent No.: US 8,653,543 B2
(45) Date of Patent: Feb. 18, 2014

(54) DEPOSITION SUBSTRATE AND METHOD FOR MANUFACTURING LIGHT-EMITTING DEVICE

(75) Inventors: Kohei Yokoyama, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 360 days.

(21) Appl. No.: 13/092,272

(22) Filed: Apr. 22, 2011

(65) Prior Publication Data
US 2011/0193124 A1  Aug. 11, 2011

Related U.S. Application Data

(62) Division of application No. 12/421,280, filed on Apr. 9, 2009, now Pat. No. 7,932,112.

(30) Foreign Application Priority Data

Apr. 14, 2008  (JP) ................................. 2008-104906

(51) Int. Cl.
 *H01L 29/18* (2006.01)
(52) U.S. Cl.
 USPC .............. 257/88; 257/E51.018; 257/E51.026; 438/34
(58) Field of Classification Search
 USPC .............. 257/88, E51.018, E51.026; 438/34; 430/6, 200
 See application file for complete search history.

(56) References Cited

U.S. PATENT DOCUMENTS

| | | | |
|---|---|---|---|
| 4,752,455 A | | 6/1988 | Mayer |
| 5,851,709 A | * | 12/1998 | Grande et al. .................... 430/7 |
| 5,937,272 A | * | 8/1999 | Tang ............................... 438/30 |
| 6,165,543 A | | 12/2000 | Otsuki et al. |
| 6,283,060 B1 | | 9/2001 | Yamazaki et al. |

(Continued)

FOREIGN PATENT DOCUMENTS

| | | |
|---|---|---|
| EP | 0 883 190 A2 | 12/1998 |
| EP | 0 913 870 A2 | 5/1999 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Trung Q Dang
(74) *Attorney, Agent, or Firm* — Husch Blackwell LLP

(57) ABSTRACT

The deposition substrate of the present invention includes a light-transmitting substrate having a first region and a second region. In the first region, a first heat-insulating layer transmitting light is provided over the light-transmitting substrate, a light absorption layer is provided over the first heat-insulating layer, and a first organic compound-containing layer is provided over the light absorption layer. In the second region, a reflective layer is provided over the light-transmitting substrate, a second heat-insulating layer is provided over the reflective layer, and a second organic compound-containing layer is provided over the second heat-insulating layer. The edge of the second heat-insulating layer is placed inside the edge of the reflective layer, and there is a space between the first heat-insulating layer and the second heat-insulating layer.

48 Claims, 27 Drawing Sheets

(56) References Cited

U.S. PATENT DOCUMENTS

| | | |
|---|---|---|
| 6,566,032 B1 | 5/2003 | Boroson et al. |
| 6,610,455 B1 | 8/2003 | Burberry et al. |
| 6,689,492 B1 | 2/2004 | Yamazaki et al. |
| 6,695,029 B2 | 2/2004 | Phillips et al. |
| 6,703,179 B2 | 3/2004 | Tyan |
| 6,776,847 B2 | 8/2004 | Yamazaki et al. |
| 6,811,938 B2 | 11/2004 | Tutt et al. |
| 7,223,514 B2 | 5/2007 | Kang et al. |
| 7,316,983 B2 | 1/2008 | Yamazaki et al. |
| 7,674,749 B2 | 3/2010 | Kang et al. |
| 7,691,783 B2 | 4/2010 | Matsuda et al. |
| 7,887,987 B2 | 2/2011 | Matsuo |
| 7,951,521 B2 | 5/2011 | Matsuo |
| 2004/0065902 A1 | 4/2004 | Yamazaki et al. |
| 2004/0132293 A1* | 7/2004 | Takayama et al. ............ 438/689 |
| 2004/0191564 A1 | 9/2004 | Kim et al. |
| 2005/0005848 A1 | 1/2005 | Yamazaki et al. |
| 2005/0116617 A1* | 6/2005 | Lee et al. ...................... 313/500 |
| 2005/0134171 A1* | 6/2005 | Kobayashi ................... 313/504 |
| 2005/0145326 A1 | 7/2005 | Hatwar |
| 2006/0084006 A1* | 4/2006 | Kang et al. ................... 430/199 |
| 2006/0243377 A1 | 11/2006 | Matsuo et al. |
| 2006/0246240 A1* | 11/2006 | Matsuda et al. ........... 428/32.39 |
| 2007/0235858 A1* | 10/2007 | Ohara ........................... 257/704 |
| 2008/0026543 A1 | 1/2008 | Miyairi et al. |
| 2008/0055729 A1* | 3/2008 | Li et al. ........................ 359/601 |
| 2008/0055901 A1* | 3/2008 | Sanpei et al. ................. 362/235 |
| 2008/0081115 A1 | 4/2008 | Yamazaki et al. |
| 2008/0113292 A1* | 5/2008 | Matsuo ...................... 430/270.1 |
| 2008/0299496 A1 | 12/2008 | Hirakata et al. |
| 2009/0075214 A1 | 3/2009 | Hirakata et al. |
| 2009/0104403 A1 | 4/2009 | Aoyama et al. |
| 2009/0104835 A1* | 4/2009 | Aoyama et al. ................. 445/58 |
| 2009/0142510 A1 | 6/2009 | Takahashi et al. |
| 2009/0197017 A1* | 8/2009 | Tanaka et al. ................ 427/596 |
| 2009/0220706 A1* | 9/2009 | Yamazaki et al. ............ 427/596 |

FOREIGN PATENT DOCUMENTS

| | | |
|---|---|---|
| EP | 1 650 046 A1 | 4/2006 |
| EP | 1 787 822 A2 | 5/2007 |
| JP | 11-54275 | 2/1999 |
| JP | 11-237504 | 8/1999 |
| JP | 2000-256877 | 9/2000 |
| JP | 2003-313654 | 11/2003 |
| JP | 2004-103406 | 4/2004 |
| JP | 2006-123546 | 5/2006 |
| JP | 2006-309995 | 11/2006 |
| JP | 2006-344459 | 12/2006 |
| JP | 2007-141702 | 6/2007 |
| JP | 2007-518228 | 7/2007 |
| JP | 2008-66147 | 3/2008 |
| WO | WO 2005/069398 A2 | 7/2005 |

* cited by examiner

DEPOSITION SUBSTRATE AND METHOD FOR MANUFACTURING LIGHT-EMITTING DEVICE

This application is a divisional of U.S. application Ser. No. 12/421,280 filed on Apr. 9, 2009 now U.S. Pat. No. 7,932,112.

BACKGROUND OF THE INVENTION

1. Field of the Invention

The present invention relates to a deposition substrate and a method for manufacturing a light-emitting device.

2. Description of the Related Art

In a light-emitting device provided with an electroluminescent (hereinafter also referred to as EL) element, a color light-emitting element that emits color light is used to perform a full-color display. In order to form the color light-emitting element, a light-emitting material of each color needs to be formed in a fine pattern on an electrode.

In general, light-emitting materials are deposited by an evaporation method, which has a problem in that a material-use efficiency is low, the size of a substrate is limited, and so on, and thus is not suitable for industrialization that requires high productivity and low cost.

As a technique for solving the aforementioned problem, a method has been proposed in which a light-emitting layer is formed by transferring a light-emitting material to an element-formation substrate by laser thermal transfer (for example, see Reference 1: Japanese Published Patent Application No. 2006-309995). In Reference 1, laser light is emitted using a transferring substrate that has a transfer layer including a light-emitting layer, and a photothermal conversion layer including a low-absorption region and a high-absorption region that have different absorption rates for the laser light, whereby heat necessary for sublimation of the transfer layer is selectively supplied to the high-absorption region.

SUMMARY OF THE INVENTION

However, in the aforementioned transferring substrate disclosed in Reference 1, the low-absorption region touches the high-absorption region in the photothermal conversion layer. Accordingly, heat generated in the high-absorption region is conducted to the low-absorption region to sublime the transfer layer on the low-absorption region, which causes a problem in that the transferred light-emitting layer has a misaligned or deformed pattern.

It is an object of one aspect of the present invention to provide a deposition substrate and a deposition method for forming a thin film in a fine pattern on a deposition-target substrate without providing a mask between an evaporation material and the deposition-target substrate. It is another object of one aspect of the present invention to manufacture a high-definition light-emitting device with high productivity by forming a light-emitting element with the use of such a deposition method.

In the present invention, a deposition substrate in which a first region and a second region that reflect a deposition pattern are formed over a light-transmitting substrate is used. An organic compound-containing layer formed over the first region that is a deposition region on a deposition-target substrate placed facing the deposition substrate is selectively heated so that a material contained in the organic compound-containing layer is deposited from the deposition substrate on the deposited-target substrate. In the first region, a light absorption layer is formed to absorb emitted light so that heat is supplied to the organic compound-containing layer. In the second region, a reflective layer is formed to reflect emitted light so that heat is not supplied to the organic compound-containing layer.

The first region and the second region each include a heat-insulating layer to prevent the light absorption layer in the first region from touching the reflective layer in the second region. An opening is formed in the heat-insulating layer in the second region to surround the first region so that the heat-insulating layers are not continuously deposited in the first region and the second region. Accordingly, the heat-insulating layer in the first region is spatially separated from that in the second region: a first heat-insulating layer is provided in the first region and a second heat-insulating layer is provided in the second region so as to have a distance (a space) from the first heat-insulating layer.

When there is a space (a distance) between the first heat-insulating layer in the first region and the second heat-insulating layer in the second region, it is possible to increase the heat conduction path from the light absorption layer in the first region to a second organic compound-containing layer in the second region. Therefore, the time for the heat generated in the light absorption layer in the first region to reach the second region increases. Furthermore, the heat is absorbed or diffused to be dissipated while passing through the conduction path, namely, the first heat-insulating layer, the light-transmitting substrate, and the second heat-insulating layer. It is preferable that the heat conduction path include elements made of different materials, such as the first heat-insulating layer, the light-transmitting substrate, and the second heat-insulating layer, because more heat can be absorbed or diffused to be dissipated when passing therethrough. Thus, a large part of the second organic compound-containing layer can be left in the deposition substrate; therefore, a film reflecting the pattern of the first region can be selectively deposited in a fine pattern on a deposition-target substrate. In addition, even when lamp light, which requires a longer irradiation time than laser light, is used, the second organic compound-containing layer in the second region can be prevented from being heated and the temperature difference between the first region and the second region can be kept; thus, a lamp can be used as a light source. A larger area can be treated at a time with lamp light as compared with laser light, resulting in reduction in manufacturing time and improvement in throughput.

Note that in this specification, a substrate on which a thin film is formed in a fine pattern is referred to as a deposition-target substrate, and a substrate for supplying a material to be formed on the deposition-target substrate is referred to as a deposition substrate. In addition, a heat conduction path means an element such as a heat-insulating layer included in a deposition substrate, and does not include space such as air.

According to an aspect of the present invention, a deposition substrate includes a light-transmitting substrate having a first region and a second region. In the first region, a first heat-insulating layer transmitting light is provided over the light-transmitting substrate, a light absorption layer is provided over the first heat-insulating layer, and a first organic compound-containing layer is provided over the light absorption layer. In the second region, a reflective layer is provided over the light-transmitting substrate, a second heat-insulating layer is provided over the reflective layer, and a second organic compound-containing layer is provided over the second heat-insulating layer. The edge of the second heat-insulating layer is placed inside the edge of the reflective layer, and there is a space between the first heat-insulating layer and the second heat-insulating layer.

According to another aspect of the present invention, a deposition substrate includes a light-transmitting substrate having a first region and a second region. In the first region, a first heat-insulating layer transmitting light is provided over the light-transmitting substrate, a first light absorption layer is provided over the first heat-insulating layer, and a first organic compound-containing layer is provided over the first light absorption layer. In the second region, a reflective layer is provided over the light-transmitting substrate, a second heat-insulating layer is provided over the reflective layer, a second light absorption layer is provided over the second heat-insulating layer, and a second organic compound-containing layer is provided over the second light absorption layer. The edge of the second heat-insulating layer is placed inside the edge of the reflective layer, and there is a space between the first heat-insulating layer and the second heat-insulating layer.

According to another aspect of the present invention, a deposition substrate includes a light-transmitting substrate having a first region and a second region. In the first region, a first heat-insulating layer transmitting light is provided over the light-transmitting substrate, a light absorption layer is provided over the first heat-insulating layer, a first reflective layer is provided over the light absorption layer, and a first organic compound-containing layer is provided over the first reflective layer. In the second region, a second reflective layer is provided over the light-transmitting substrate, a second heat-insulating layer is provided over the second reflective layer, and a second organic compound-containing layer is provided over the second heat-insulating layer. The edge of the second heat-insulating layer is placed inside the edge of the second reflective layer, and there is a space between the first heat-insulating layer and the second heat-insulating layer.

The second heat-insulating layer in the second region may be provided under the reflective layer, and the light-transmitting substrate, the second heat-insulating layer, and the reflective layer may be stacked in this order. For example, according to another aspect of the present invention, a deposition substrate includes a light-transmitting substrate having a first region and a second region. In the first region, a first heat-insulating layer transmitting light is provided over the light-transmitting substrate, a light absorption layer is provided over the first heat-insulating layer, and a first organic compound-containing layer is provided over the light absorption layer. In the second region, a second heat-insulating layer is provided over the light-transmitting substrate, a reflective layer is provided over the second heat-insulating layer, and a second organic compound-containing layer is provided over the reflective layer. The edge of the second heat-insulating layer is placed inside the edge of the reflective layer, and there is a space between the first heat-insulating layer and the second heat-insulating layer.

In the aforementioned structures, a third heat-insulating layer may be provided between the second heat-insulating layer and the second organic compound-containing layer. By providing the third heat-insulating layer, it is possible to increase the heat conduction path from the light absorption layer (or the first light absorption layer) formed in the first region to the second organic compound-containing layer formed in the second region, which makes it more difficult to conduct heat generated in the light absorption layer (or the first light absorption layer) to the second organic compound-containing layer.

In the case where the first heat-insulating layer and the second heat-insulating layer are provided under the reflective layer, the first heat-insulating layer and the second heat-insulating layer may be formed by processing the light-transmitting substrate. In that case, the first heat-insulating layer and the second heat-insulating layer are projections on the surface of the light-transmitting substrate, which are parts of the light-transmitting substrate.

By using any of the aforementioned deposition substrates of the present invention, a thin film can be deposited on a deposition-target substrate and a light-emitting device can be manufactured. According to one aspect of the present invention, a method for manufacturing a light-emitting device uses a deposition substrate including a light-transmitting substrate having a first region and a second region. In the first region, a first heat-insulating layer transmitting light is provided over the light-transmitting substrate, a light absorption layer is provided over the first heat-insulating layer, and a first organic compound-containing layer is provided over the light absorption layer. In the second region, a reflective layer is provided over the light-transmitting substrate, a second heat-insulating layer is provided over the reflective layer, and a second organic compound-containing layer is provided over the second heat-insulating layer. The edge of the second heat-insulating layer is placed inside the edge of the reflective layer, and there is a space between the first heat-insulating layer and the second heat-insulating layer. The method for manufacturing a light-emitting device of the present invention includes the steps of: placing the deposition substrate and a deposition-target substrate so that surfaces of the first organic compound-containing layer and the second organic compound-containing layer on the deposition substrate face a surface of the deposition-target substrate, on which a first electrode layer is formed; irradiating the light absorption layer with light through the light-transmitting substrate and the first heat-insulating layer; forming a light-emitting layer by depositing a material contained in the first organic compound-containing layer over the light absorption layer irradiated with light on the first electrode layer on the deposition-target substrate; and forming a second electrode layer on the light-emitting layer.

According to another aspect of the present invention, a method for manufacturing a light-emitting device uses a deposition substrate including a light-transmitting substrate having a first region and a second region. In the first region, a first heat-insulating layer transmitting light is provided over the light-transmitting substrate, a light absorption layer is provided over the first heat-insulating layer, and a first organic compound-containing layer is provided over the light absorption layer. In the second region, a second heat-insulating layer is provided over the light-transmitting substrate, a reflective layer is provided over the second heat-insulating layer, and a second organic compound-containing layer is provided over the reflective layer. The edge of the second heat-insulating layer is placed inside the edge of the reflective layer, and there is a space between the first heat-insulating layer and the second heat-insulating layer. The method for manufacturing a light-emitting device of the present invention includes the steps of: placing the deposition substrate and a deposition-target substrate so that surfaces of the first organic compound-containing layer and the second organic compound-containing layer on the deposition substrate face a surface of the deposition-target substrate, on which a first electrode layer is formed; irradiating the light absorption layer with light through the light-transmitting substrate and the first heat-insulating layer; forming a light-emitting layer by depositing a material contained in the first organic compound-containing layer over the light absorption layer irradiated with light on the first electrode layer on the deposition-target substrate; and forming a second electrode layer on the light-emitting layer.

In the case where a light-emitting layer is formed by using the present invention, the first region may correspond to one pixel, or the first region may correspond to a plurality of pixels to manufacture light-emitting layers of the plurality of pixels at a time.

According to the present invention, a thin film can be formed in a fine pattern on a deposition-target substrate without providing a mask between an evaporation material and the deposition-target substrate.

The step of irradiating the light absorption layer with light is preferably performed in a reduced pressure. When light is emitted in a reduced pressure so that a material is deposited on a deposition-target substrate, the effect of contaminants such as dust on a deposited film can be reduced.

Light irradiation may be performed using light that can be absorbed by the light absorption layer, and lamp light using a lamp as a light source or laser light using a laser as a light source may be used.

In addition, laser light having a repetition rate of 10 MHz or more and a pulse width of 100 fs to 10 ns may be used for light irradiation. By using such laser light having a very short pulse width, thermal conversion is efficiently performed in a light absorption layer so that a material can be heated efficiently. Furthermore, since the laser light having a repetition rate of 10 MHz or more and a pulse width of 100 fs to 10 ns can be emitted in a short time, thermal diffusion can be suppressed and a fine pattern can be deposited. Still furthermore, the laser light having a repetition rate of 10 MHz or more and a pulse width of 100 fs to 10 ns can emit high output power; thus, a large area can be treated at a time. In addition, by shaping the laser light into a linear or rectangular beam on an irradiated surface, a processed substrate can be efficiently scanned with the laser light. Accordingly, time necessary for deposition (takt time) is reduced, resulting in improvement of productivity.

It is preferable that the heat-insulating layer have a light transmittance of 60% or more and be formed of a material having a lower thermal conductivity than a material used for the reflective layer and the light absorption layer. With a low thermal conductivity, heat generated from emitted light can be efficiently used for deposition.

The organic compound-containing layer is formed of a liquid composition containing an organic compound and deposited on the first electrode formed on the deposition-target surface of the deposition-target substrate, whereby a light-emitting element can be formed. An EL layer can be formed in a fine pattern on the deposition-target substrate so that each light-emitting color can be individually deposited. A high-definition light-emitting device having such a light-emitting element can be manufactured.

Since a large area can be treated by the invention, a thin film can be formed with high productivity even on a deposition-target substrate having a large area. Thus, high-definition light-emitting device and electronic device can be manufactured at low cost.

According to one aspect of the present invention, a thin film can be formed in a fine pattern on a deposition-target substrate without providing a mask between an evaporation material and the deposition-target substrate. According to another aspect of the present invention, a light-emitting element can be formed by such a deposition method and a high-definition light-emitting device can be manufactured. Furthermore, a thin film can be formed on a deposition-target substrate having a large area by one aspect of the present invention; therefore, large-sized light-emitting device and electronic device can be manufactured.

DETAILED DESCRIPTION OF THE INVENTION

Figure 1A:
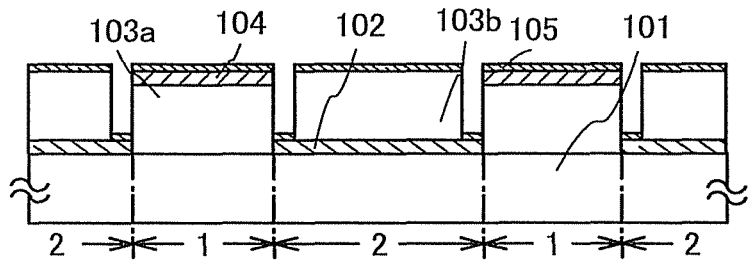
FIGS. 1A to 1D are cross-sectional views illustrating a deposition substrate and a deposition method of the present invention.
Figure 1B:
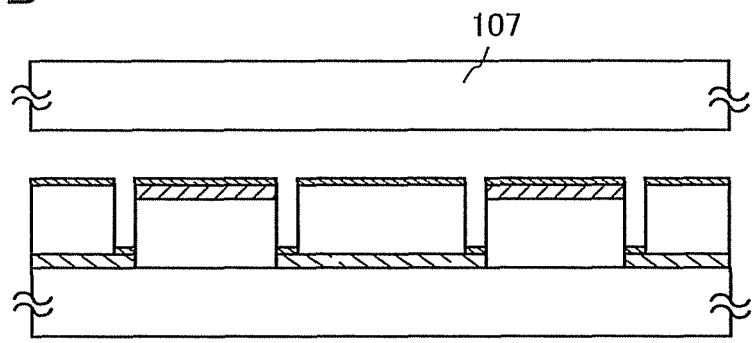

Embodiment modes of the present invention will be described below with reference to the drawings. Note that the present invention is not limited to the description given below, and it is to be understood that various changes and modifications will be apparent to those skilled in the art unless such changes and modifications depart from the spirit and scope of the present invention. Accordingly, the present invention should not be construed as being limited to the description of the embodiment modes given below. Note that in all the drawings for explaining the embodiment modes, the identical portions or portions having a similar function are denoted by the identical reference numerals, and description thereof is omitted.

Embodiment Mode 1

In this embodiment mode, examples of a deposition substrate and a deposition method will be described with reference to FIGS. 1A to 1D, FIGS. 2A to 2F, FIGS. 3A to 3D, and FIGS. 4A to 4E, which are intended to form a thin film in a fine pattern on a deposition-target substrate by the present invention.

FIG. 1A illustrates an example of a deposition substrate. The deposition substrate includes a first region (reference numeral 1 in the drawing) and a second region (reference numeral 2 in the drawing) as illustrated in FIG. 1A.

In the first region, an organic compound-containing layer is heated by light irradiation so that the material in the layer is deposited on a deposition-target substrate that is placed facing the deposition substrate. In the second region, emitted light is reflected so that an organic compound-containing layer is not heated to remain in the deposition substrate.

Accordingly, in the first region, a light absorption layer is formed to absorb emitted light so that heat is supplied to the organic compound-containing layer, and in the second region, a reflective layer is formed to reflect light so that heat is not supplied to the organic compound-containing layer.

In the first region, a first heat-insulating layer 103a is formed over a first substrate 101, and a light absorption layer 104 is fainted over the first heat-insulating layer 103a. In the second region, a reflective layer 102 is formed over the first substrate 101, and a second heat-insulating layer 103b is formed over the reflective layer 102. Thus, an organic compound-containing layer 105 is formed as the uppermost layer of the first region and the second region. The light absorption layer 104 in the first region and the reflective layer 102 in the second region are separated by the first heat-insulating layer 103a not to be in contact with each other.

The heat-insulating layer in the first region is spatially separated from that in the second region. The first heat-insulating layer 103a is provided in the first region, and the second heat-insulating layer 103b is provided in the second region so as to have a distance (a space) from the first insulating layer 103a. Therefore, the edge of the second heat-insulating layer 103b is placed inside the edge of the reflective layer 102.

Figure 26A:
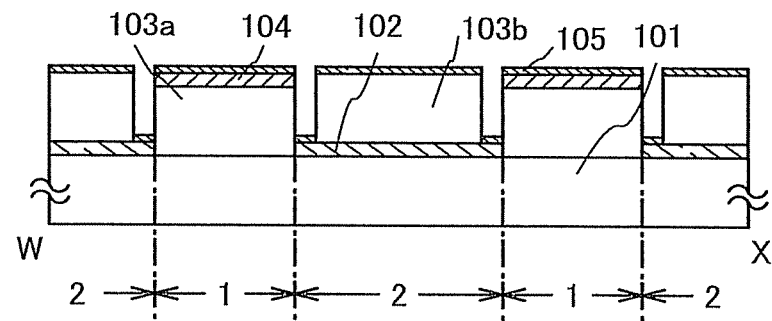
FIGS. 26A and 26B are respectively a cross-sectional view and a top view illustrating an example of a deposition substrate of the present invention.
Figure 26B:
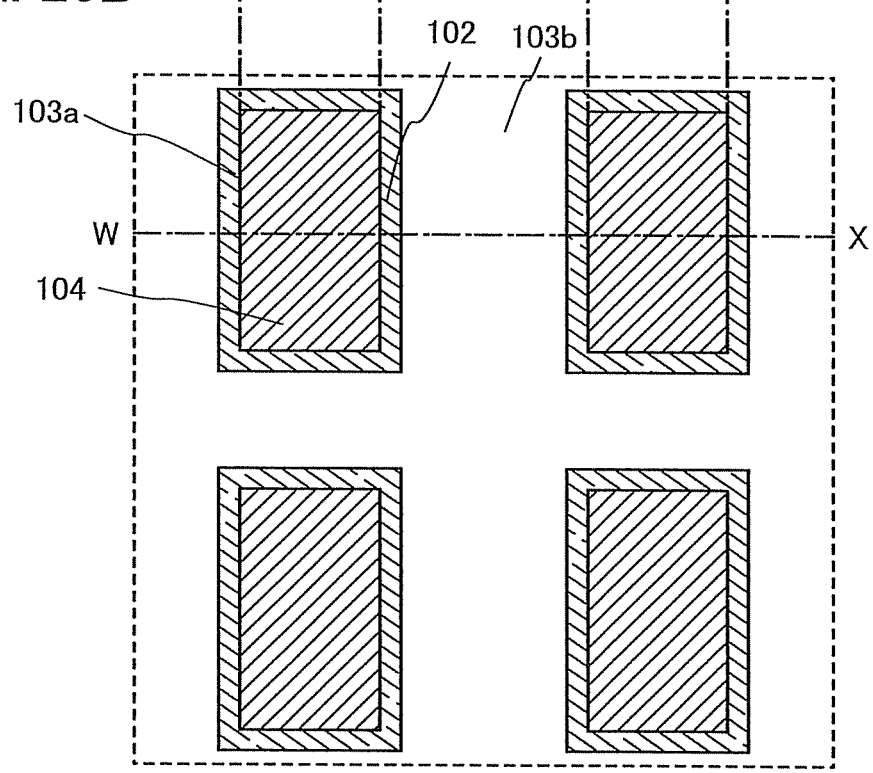

In the present invention, a region corresponding to part of the deposition-target substrate where a thin film is to be formed is referred to as the first region, and there is a distance between the first heat-insulating layer formed in the first region and the second heat-insulating layer formed in the second region. Thus, a space is formed in the second region to surround the first heat-insulating layer formed in the first region. FIG. 26B is a top view of the deposition substrate illustrated in FIG. 1A. Note that FIG. 26A is a cross-sectional view of the deposition substrate as illustrated in FIG. 1A, which is taken along line W-X of FIG. 26B. As illustrated in FIGS. 26A and 26B, between the first heat-insulating layer 103a formed in the first region and the second heat-insulating layer 103b formed in the second region, there is a space surrounding the first heat-insulating layer 103a, and the reflective layer 102 is exposed. Note that in FIG. 26A, the organic compound-containing layer 105 is omitted in order to clearly show the positional relationship between the first heat-insulating layer 103a and the second heat-insulating layer 103b.

In some cases, the side surface of the heat-insulating layer (the first heat-insulating layer and the second heat-insulating layer) has an angle less than 90° with respect to the surface of the substrate and is tapered depending on the etching method or etching conditions.

In the present invention, deposition is performed by irradiating the light absorption layer 104 formed over the first substrate 101 with light from the first substrate 101 side. Therefore, the first substrate 101 needs to have a light-transmitting property; the reflective layer 102, reflectivity; the first heat-insulating layer 103a, a light-transmitting property; and the light absorption layer 104, an absorption property, with respect to the light. Accordingly, the kind of materials suitable for the first substrate 101, the reflective layer 102, the first heat-insulating layer 103a, and the light absorption layer 104 varies depending on the wavelength of emitted light, and thus needs to be selected as appropriate.

In addition, the first substrate 101 is preferably made of a material having a low thermal conductivity. With a low thermal conductivity, heat generated from emitted light can be efficiently used for deposition. As the first substrate 101, for example, a glass substrate, a quartz substrate, or a plastic substrate containing an inorganic material can be used. As the glass substrate, is it possible to use a variety of so-called non-alkali glass substrates used in the electronics industry, such as an aluminosilicate glass substrate, an aluminoborosilicate glass substrate, or a barium borosilicate glass substrate.

The reflective layer 102 is a layer for reflecting light so that the light absorption layer 104 is selectively irradiated with the light during deposition. Therefore, the reflective layer 102 is preferably made of a material having a high reflectance with respect to the emitted light. Specifically, the reflective layer 102 preferably has a reflectance of 85% or more, and more preferably, a reflectance of 90% or more with respect to the emitted light.

As a material for the reflective layer 102, for example, silver, gold, platinum, copper, an alloy containing aluminum, or an alloy containing silver can be used.

The thickness of the reflective layer 102, which depends on a material, is preferably 100 nm or more. If the reflective layer 102 has a thickness of 100 nm or more, the emitted light can be prevented from passing therethrough.

Furthermore, the reflective layer 102 can be processed into a desired shape by a variety of methods, but is preferably processed by dry etching. By use of dry etching, a sharp sidewall can be formed and thus a fine pattern can be obtained.

The function of the first heat-insulating layer 103a is to prevent heat generated from light absorbed by the light absorption layer 104 from being conducted to the second region and to supply enough heat to the organic compound-containing layer 105 formed over the light absorption layer 104. In addition, the first heat-insulating layer 103a and the second heat-insulating layer 103b prevent the heat remaining in the reflective layer 102, which is generated from part of the light reflected by the reflective layer 102, or the heat generated in the light absorption layer 104 in the first region from being conducted to the organic compound-containing layer 105 formed in the second region. In the present invention, it is preferable that a heat-insulating layer completely block heat conduction; however, in this specification, a layer that blocks heat conduction more than at least a light absorption layer is also referred to as a heat-insulating layer.

Thus, the first heat-insulating layer 103a and the second heat-insulating layer 103b need to be made of a material having a lower thermal conductivity than materials used for the reflective layer 102 and the light absorption layer 104. In the case of the structure illustrated in FIGS. 1A to 1D, the light absorption layer 104 is irradiated with light through the first heat-insulating layer 103a; therefore, the first heat-insulating layer 103a needs to have a light-transmitting property. In that case, the first heat-insulating layer 103a in the present invention needs to be made of a material that has a high light transmittance as well as a low thermal conductivity. Specifically, the first heat-insulating layer 103a is preferably made of a material having a light transmittance of 60% or more.

As a material used for the first heat-insulating layer 103a and the second heat-insulating layer 103b, for example, titanium oxide, silicon oxide, silicon nitride oxide, zirconium oxide, or silicon carbide can be used.

The thickness of each of the first heat-insulating layer 103a and the second heat-insulating layer 103b, which depends on a material, is preferably 10 nm to 2 μm, and more preferably 100 nm to 1 μm. With a thickness of 10 nm to 2 μm, the first heat-insulating layer 103a and the second heat-insulating layer 103b can transmit light while preventing heat from being conducted to the organic compound-containing layer 105 in the second region.

The light absorption layer 104 absorbs light emitted during deposition. Therefore, the light absorption layer 104 is preferably made of a material that has a low reflectance and a high absorptance with respect to the emitted light. Specifically, it is preferable that the light absorption layer 104 have a reflectance of 70% or less with respect to the emitted light.

Various kinds of materials can be used for the light absorption layer 104. For example, a metal nitride such as titanium nitride, tantalum nitride, molybdenum nitride, or tungsten nitride, a metal such as titanium, molybdenum, or tungsten, or carbon can be used. Note that the kind of material suitable for the light absorption layer 104 varies depending on the wavelength of emitted light, and thus needs to be selected as appropriate. In addition, the light absorption layer 104 is not limited to a single layer and may include a plurality of layers. For example, the light absorption layer 104 may have a stacked structure of a metal layer and a metal nitride layer.

The reflective layer 102, the first heat-insulating layer 103a, the second heat-insulating layer 103b, and the light absorption layer 104 can be formed by a variety of methods. For example, these layers can be formed by sputtering, electron beam evaporation, vacuum evaporation, chemical vapor deposition (CVD), or the like.

The thickness of the light absorption layer 104, which depends on a material, is preferably large enough to prevent transmission of emitted light. Specifically, the light absorption layer 104 preferably has a thickness of 10 nm to 2 μm. In addition, it is more preferable that the light absorption layer 104 have a thickness of 10 nm to 300 nm because deposition can be performed using light with a lower energy when the light absorption layer 104 has a smaller thickness. For example, in the case of emitting light having a wavelength of 532 μm, the light absorption layer 104 with a thickness of 50 nm to 200 nm can efficiently absorb the emitted light to generate heat. Furthermore, the light absorption layer 104 with a thickness of 50 nm to 200 nm allows highly accurate deposition on the deposition-target substrate.

The light absorption layer 104 may partially transmit the emitted light as long as a material contained in the organic compound-containing layer 105 can be heated to the deposition temperature (the temperature at which at least part of the material contained in the organic compound-containing layer 105 is deposited on the deposition-target substrate). Note that when the light absorption layer 104 partially transmits the emitted light, the material contained in the organic compound-containing layer 105 needs to be a material that is not decomposed by light.

In addition, the greater the difference in reflectance between the reflective layer 102 and the light absorption layer 104 is, the more preferable it is. Specifically, the difference in reflectance to the wavelength of the emitted light is preferably 25% or more, and more preferably 30% or more.

The organic compound-containing layer 105 contains a material to be deposited on the deposition-target substrate. By irradiating the deposition substrate with light, the material contained in the organic compound-containing layer 105 is heated to be at least partially deposited on the deposition-target substrate. When the organic compound-containing layer 105 is heated, at least part of the material contained in the organic compound-containing layer 105 is vaporized or at least part of the organic compound-containing layer 105 is deformed by heat, whereby the film is separated due to a change in stress and deposited on the deposition-target substrate.

The organic compound-containing layer 105 is formed by a variety of methods. For example, the following wet processes can be used: spin coating, roll coating, die coating, blade coating, bar coating, gravure coating, spraying, casting, dipping, droplet discharging (ejecting) (an ink-jet method), a dispenser method, and various printings (a method by which a film can be formed in a desired pattern, such as screen (mimeograph) printing, offset (planographic) printing, letterpress printing, or gravure (intaglio) printing). Alternatively, a dry process such as vacuum evaporation, CVD, or sputtering can also be used.

The organic compound-containing layer 105 may contain a variety of organic compound materials or a variety of inorganic compound materials. In the case where an EL layer of a light-emitting element is formed, a material that can be deposited to form the EL layer is used. For example, it is possible to use an organic compound for forming an EL layer, such as a light-emitting material or a carrier-transporting material, as well as an inorganic compound for forming an electrode or the like of a light-emitting element, such as metal oxide, metal nitride, metal halide, or an elementary substance of metal.

The organic compound-containing layer 105 may contain a plurality of materials. Furthermore, the organic compound-containing layer 105 may be a single layer or a stack of a plurality of layers.

In order to form the organic compound-containing layer 105 by a wet process, a desired material may be dissolved or dispersed in a solvent, and a liquid composition (a solution or a dispersion solution) may be adjusted. There is no particular limitation on the solvent as long as a material can be dissolved or dispersed therein and the material does not react therewith. Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of those solvents may also be used. By using a wet process, material use efficiency can be increased, resulting in reduction in production cost.

In the case where the thickness and uniformity of a film formed on the deposition-target substrate are controlled with the organic compound-containing layer 105, the thickness and uniformity of the organic compound-containing layer 105 need to be controlled. However, the organic compound-containing layer 105 is not necessarily a uniform layer if it does not affect the thickness and uniformity of the film formed on the deposition-target substrate. For example, the organic compound-containing layer 105 may be formed in a fine island shape or as a layer having unevenness.

A method for manufacturing the deposition substrate illustrated in FIG. 1A will be described with reference to FIGS. 2A to 2F.

Figure 2A:
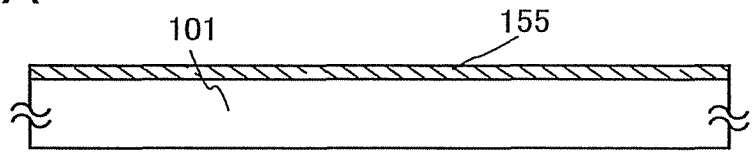
FIGS. 2A to 2F are cross-sectional views illustrating a method for manufacturing a deposition substrate of the present invention.
Figure 2B:
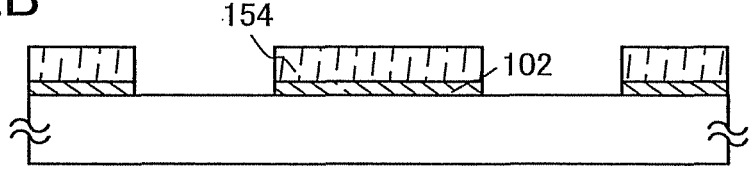
Figure 2C:
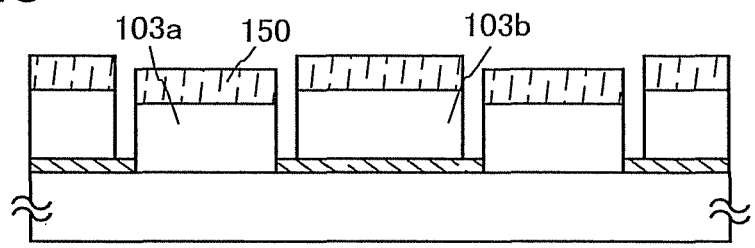

A reflective layer 155 is formed over the first substrate 101 (see FIG. 2A). Then, a mask 154 is formed over the reflective layer 155 and the reflective layer 155 is etched using the mask 154. Thus, the reflective layer 102 is formed over the first substrate 101 in the second region (see FIG. 2B). Next, an insulating layer is formed over the first substrate 101 and the reflective layer 102 and etched using a mask 150. Thus, the first heat-insulating layer 103a is formed over the first substrate 101 in the first region, and the second heat-insulating layer 103b is formed over the reflective layer 102 in the second region (see FIG. 2C). The edge of the second heat-insulating layer 103b is placed inside the edge of the reflective layer 102 so that the edge of the reflective layer 102 is exposed.

Figure 2D:
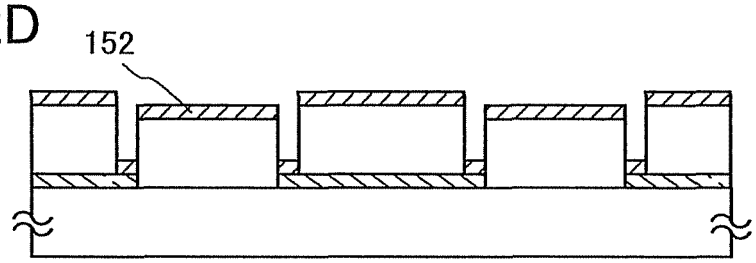

The mask 150 is removed, and a light absorption layer 152 is formed over the first heat-insulating layer 103a, the reflective layer 102, and the second heat-insulating layer 103b (see FIG. 2D). The light absorption layer 152 is divided by the first heat-insulating layer 103a and the second heat-insulating layer 103b.

Figure 2E:
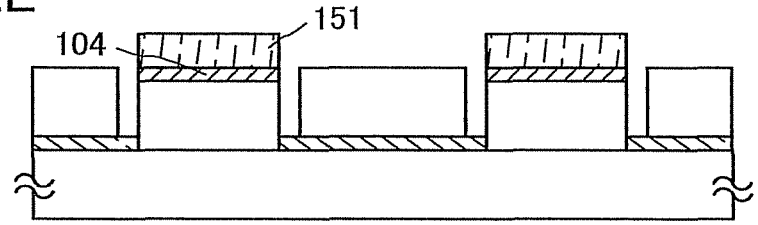

A mask 151 is formed over the light absorption layer 152, and the light absorption layer 152 is etched using the mask 151 to form the light absorption layer 104 (see FIG. 2E). The light absorption layer 104 is formed only over the first heat-insulating layer 103a in the first region.

Figure 2F:
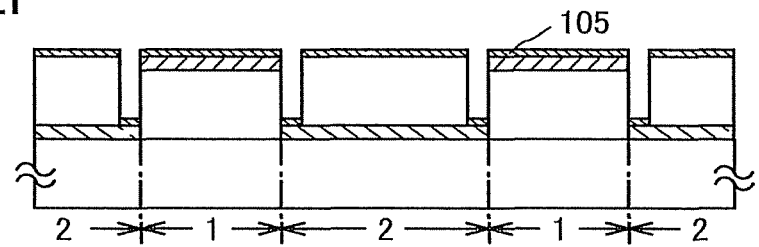

The organic compound-containing layer 105 is formed over the first heat-insulating layer 103a, the light absorption layer 104, the reflective layer 102, and the second heat-insulating layer 103b (see FIG. 2F). Through the aforementioned steps, the deposition substrate illustrated in FIG. 1A is completed.

Next, a deposition method using the deposition substrate of the present invention will be described. A second substrate 107, which is a deposition-target substrate, is placed facing the surface of the first substrate 101, which includes the reflective layer 102, the first heat-insulating layer 103a, the second heat-insulating layer 103b, the light absorption layer 104, and the organic compound-containing layer 105 (see FIG. 1B). The first substrate 101 may partially touch the second substrate 107 depending on the size or layout of the substrates.

Figure 1C:
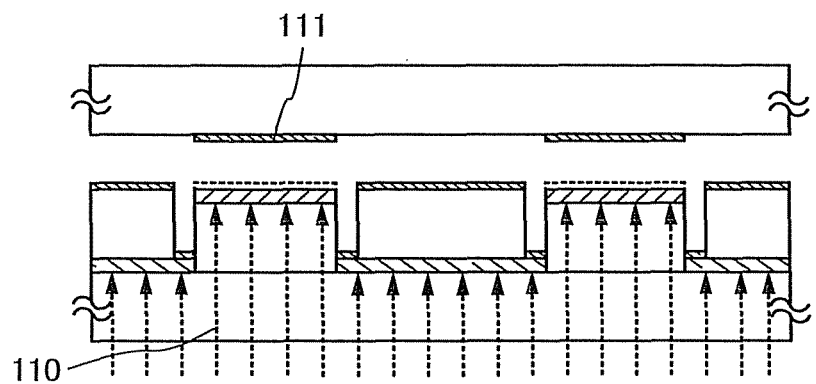
Figure 1D:
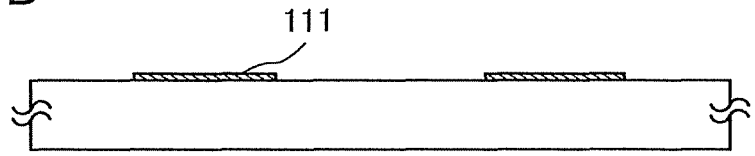

Light 110 is emitted from the back surface of the first substrate 101 (the surface that does not include the reflective layer 102, the first heat-insulating layer 103a, the second heat-insulating layer 103b, the light absorption layer 104, and the organic compound-containing layer 105) (see FIG. 1C). At this time, light emitted to the reflective layer 102 formed over the first substrate 101 in the second region is reflected, while light emitted to the first region passes through the first heat-insulating layer 103a and is absorbed by the light absorption layer 104. Then, the light absorption layer 104 generates heat from the absorbed light and supplies the heat to the organic compound-containing layer 105, whereby at least part of the material contained in the organic compound-containing layer 105 is deposited as a film 111 on the second substrate 107. Accordingly, the film 111 shaped into a desired pattern is formed on the second substrate 107 (see FIG. 1D).

Figure 27A:
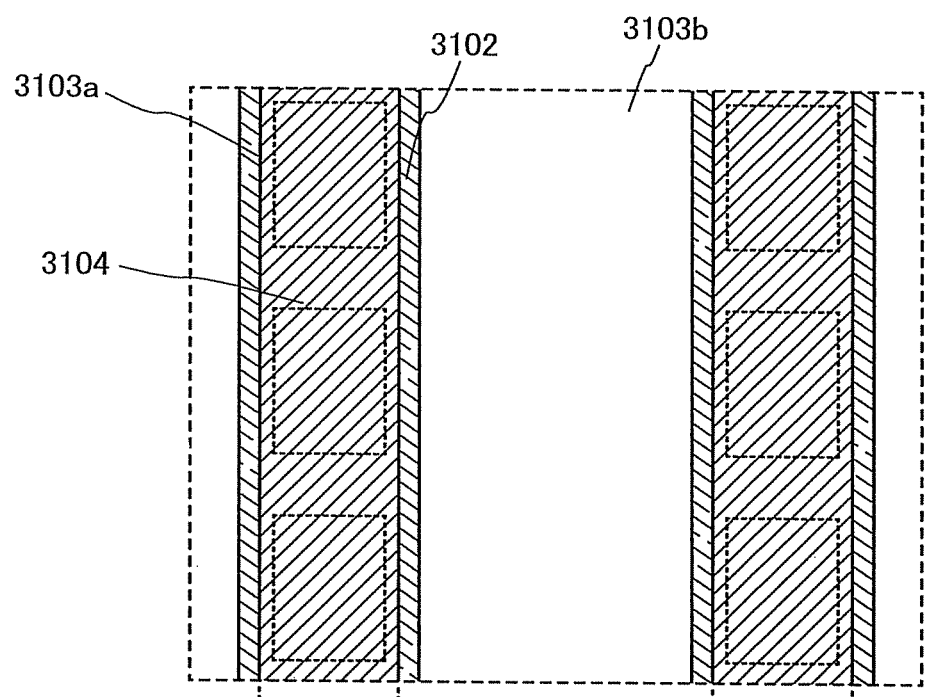
FIGS. 27A and 27B are top views illustrating manufacturing steps of a light-emitting device of the present invention.
Figure 27B:
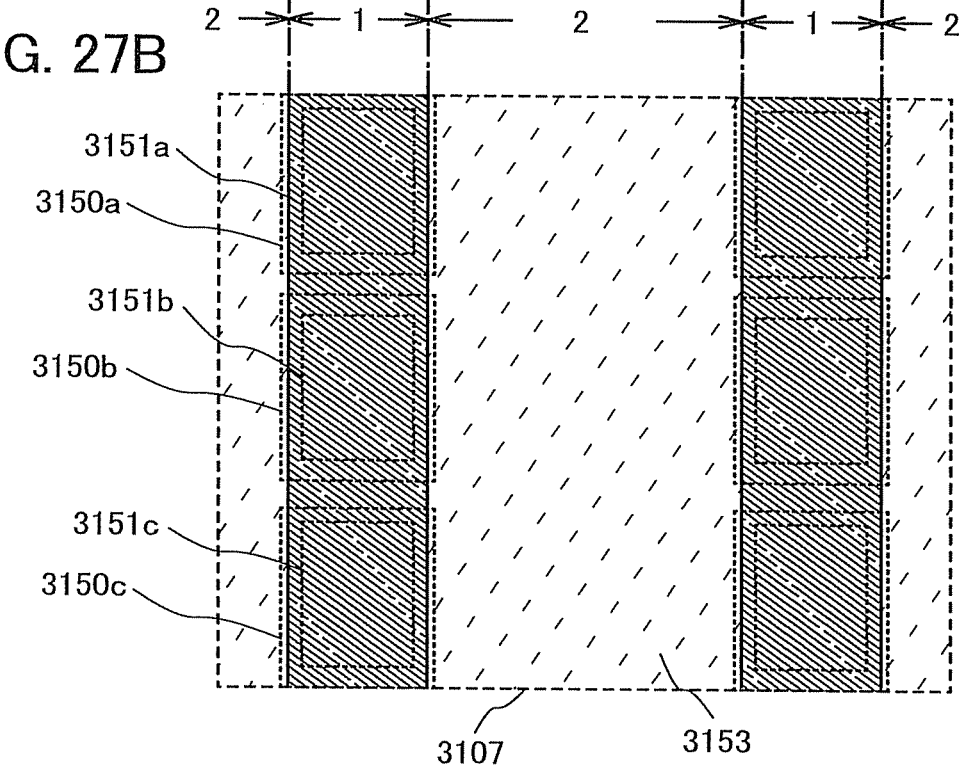

In the case where a light-emitting layer of a light-emitting device is formed by the present invention, the first region may be formed to correspond to one pixel, or may be formed to correspond to a plurality of pixels to manufacture light-emitting layers of the plurality of pixels at a time. For example, in the case where three color elements (e.g., RGB) are arranged in stripes to perform full-color display, the first region of the deposition substrate is formed to correspond to a region including a plurality of pixels emitting the same color light, whereby light-emitting layers of the plurality of pixels can be formed on a deposition-target substrate. FIG. 27A is a top view of a deposition substrate including the first region provided with a plurality of pixels. In FIG. 27A, a first heat-insulating layer 3103a formed in the first region corresponds to a region including a plurality of pixels in a deposition-target substrate 3107, and a second heat-insulating layer 3103b formed in the second region has a space surrounding the first heat-insulating layer 3103a corresponding to the region including the plurality of pixels. Reference number 3102 indicates a reflective layer and 3104 indicates a light absorption layer. FIG. 27B illustrates the deposition-target substrate 3107 on which light-emitting layers 3151a, 3151b, and 3151c are formed on first electrode layers 3150a, 3150b, and 3150c, respectively using the deposition substrate of FIG. 27A. The light-emitting layers 3151a, 3151b, and 3151c are continuously provided, but electrically isolated by a partition wall 3153 and the first electrode layers 3150a, 3150b, and 3150c formed in the respective pixels.

When there is a space (a distance) between the first heat-insulating layer 103a in the first region and the second heat-insulating layer 103b in the second region, it is possible to increase the heat conduction path from the light absorption layer 104 in the first region to the organic compound-containing layer 105 in the second region. Therefore, the time for the heat generated in the light absorption layer 104 in the first region to reach the second region increases. Furthermore, the heat is absorbed or diffused to be dissipated while passing through the first heat-insulating layer 103a, the first substrate 101, and the second heat-insulating layer 103b. It is preferable that the heat conduction path include elements made of different materials, such as the first heat-insulating layer 103a, the first substrate 101, and the second heat-insulating layer 103b, because more heat can be absorbed or diffused to be dissipated when passing therethrough. Thus, a large part of the organic compound-containing layer 105 in the second region can be left in the deposition substrate; therefore, the film 111 reflecting the pattern of the first region can be selectively deposited in a fine pattern on the second substrate 107 that is a deposition-target substrate. In addition, even when lamp light, which requires a longer irradiation time than laser light, is used, the organic compound-containing layer 105 in the second region can be prevented from being heated and the temperature difference between the first region and the second region can be kept; thus, a lamp can be used as a light source. A larger area can be treated at a time with lamp light as compared with laser light, resulting in reduction in manufacturing time and improvement in throughput.

As the light 110 to be emitted, laser light or lamp light can be used.

There is no particular limitation on the emitted light, and one or a combination of infrared light, visible light, and ultraviolet light can be used. For example, light (lamp light) emitted from an ultraviolet ray lamp, a black light, a halogen lamp, a metal halide lamp, a xenon arc lamp, a carbon arc lamp, a high-pressure sodium vapor lamp, or a high-pressure mercury vapor lamp may be used. In that case, the lamp light source may be continuously activated for a required time, or may be activated plural times.

Alternatively, laser light may be used as the light. As a laser, a laser capable of emitting ultraviolet light, visible light, or infrared light can be used. Laser light with various wavelengths can be used, and for example, laser light with a wavelength of 355 nm, 515 nm, 532 nm, 1030 nm, or 1064 nm can be used.

As the laser light, light emitted from one or more of the following can be used: a gas laser such as an Ar laser, a Kr laser, and an excimer laser; a laser whose medium is single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ that is doped with one or more of Nd, Yb, Cr, Ti, Ho, Er, Tm, and Ta as a dopant; and a solid-state laser such as a glass laser, a ruby laser, an alexandrite laser, a Ti:sapphire laser, and a fiber laser. Alternatively, a second harmonic, a third harmonic, or other higher harmonics emitted from the aforementioned solid-state laser can also be used. The use of a solid-state laser whose laser medium is solid is advantageous in that maintenance-free condition can be maintained for a long time and output power is relatively stable.

The laser spot preferably has a linear or rectangular shape. The linear or rectangular laser spot allows the processed substrate to be efficiently scanned with the laser light. Thus, time necessary for deposition (takt time) is reduced, resulting in improvement of productivity. The laser spot may also have an elliptical shape.

In the present invention, the organic compound-containing layer 105 is heated not with radiation heat from light emitted from a light source but with heat provided by the light absorption layer 104 that absorbs light from the light source. With the use of the present invention, the heat can be prevented from being conducted in a surface direction from the first region to the second region; therefore, an area of the organic compound-containing layer 105, which is heated, is not enlarged and deposition can be performed in a precise pattern. The light irradiation time is preferably set to be short if a more precise pattern is deposited.

In addition, deposition by light irradiation is preferably performed in a reduced-pressure atmosphere. Accordingly, it is preferable that the deposition chamber have a pressure of $5 \times 10^{-3}$ Pa or less, and more preferably $10^{-6}$ Pa to $10^{-4}$ Pa.

Furthermore, as the light 110 to be emitted, it is preferable to use laser light having a repetition rate of 10 MHz or more and a pulse width of 100 fs to 10 ns. By using such laser light having a very short pulse width, thermal conversion is efficiently performed in the light absorption layer 104 so that a material can be heated efficiently.

Since the laser light having a repetition rate of 10 MHz or more and a pulse width of 100 fs to 10 ns can be emitted in a short time, thermal diffusion can be suppressed and a fine pattern can be deposited. In addition, the laser light having a repetition rate of 10 MHz or more and a pulse width of 100 fs to 10 ns can emit high output power; thus, a large area can be treated at a time and time necessary for deposition can be reduced, resulting in improvement of productivity.

When the distance between the surface of the first substrate 101 and the surface of the second substrate 107 is reduced, the outermost layer of the first substrate 101 touches the outermost layer of the second substrate 107 in some cases. By reducing the distance between the surface of the first substrate 101 and the surface of the second substrate 107, the film 111 can be deposited in an accurate pattern on the second substrate 107 by light irradiation.

In the case where light passing through the opening of the reflective layer 102 may spread, the opening of the reflective layer 102 may be reduced in size in consideration of the spreading of emitted light.

In the case where a full-color display is manufactured, light-emitting layers need to be selectively formed. The deposition method of the present invention makes it easy to form light-emitting layers selectively in a desired pattern. In addition, light-emitting layers can be selectively formed with high accuracy.

With the use of the present invention, the thickness of a film deposited on the second substrate that is a deposition-target substrate can be controlled by controlling the thickness of the organic compound-containing layer formed over the first substrate. That is, the thickness of the organic compound-containing layer formed over the first substrate is controlled in advance so that the film formed on the second substrate has a desired thickness when all the material contained in the organic compound-containing layer is deposited; therefore, a thickness monitor is not necessary in the deposition on the second substrate. Accordingly, the practitioner does not need to adjust the deposition rate by using a thickness monitor, and thus the deposition process can be fully automated, resulting in improvement of productivity.

By applying the present invention, the materials contained in the organic compound-containing layer 105 formed over the first substrate can be deposited uniformly. Even in the case where the organic compound-containing layer 105 contains plural kinds of materials, a film containing the same materials in substantially the same weight ratio as the organic compound-containing layer 105 can be deposited on the second substrate that is a deposition-target substrate. Accordingly, even in the case where plural kinds of materials with different deposition temperatures are used for deposition, in the deposition method of the present invention, unlike in co-evaporation, the evaporation rate of each material does not need to be controlled. Therefore, without complicated control of the evaporation rate or the like, a desired layer containing different kinds of materials can be deposited easily and accurately.

By the deposition method of the present invention, desired materials can be deposited on a deposition-target substrate without being wasted. Thus, material use efficiency can be increased, resulting in reduction in production cost. Furthermore, materials can be prevented from being attached to an inner wall of a deposition chamber, and thus maintenance of the deposition apparatus can be facilitated.

By applying the present invention, a flat even film can be deposited. In addition, since a film can be deposited only in a desired region, a fine pattern can be aimed and a high-definition light-emitting device can be manufactured.

By applying the present invention, a film can be selectively deposited in a desired region when deposition is performed using light. Thus, material use efficiency can be increased, and a desired shape can be deposited easily and accurately, resulting in improvement of productivity. By applying the present invention, a lamp can be used as a light source when deposition is performed using light. Therefore, a large area can be treated at a time, resulting in improvement of productivity.

Embodiment Mode 2

In this embodiment mode, other examples of the deposition substrate that can be used in the present invention will be described with reference to FIGS. 3A to 3D, FIGS. 4A to 4E, FIGS. 18A to 18C, FIGS. 19A to 19D, and FIGS. 20A to 20C. Materials and manufacturing methods similar to those of Embodiment Mode 1 may be used if the function thereof is the same as that of Embodiment Mode 1.

Figure 3A:
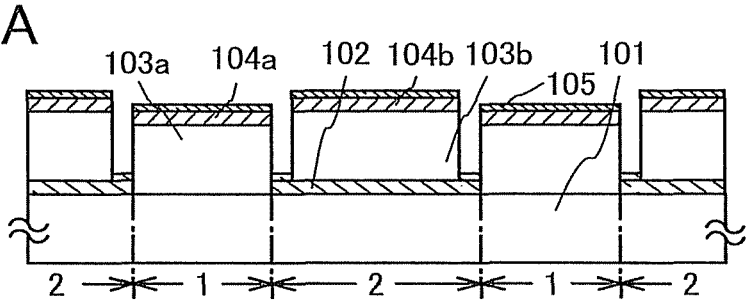
FIGS. 3A to 3D are cross-sectional views illustrating an example of a deposition substrate of the present invention.

FIG. 3A illustrates an example in which a light absorption layer is provided in both the first region and the second region. A first light absorption layer 104a is provided over the first heat-insulating layer 103a in the first region, and a second light absorption layer 104b is provided over the reflective layer 102 and the second heat-insulating layer 103b in the second region.

Figure 3B:
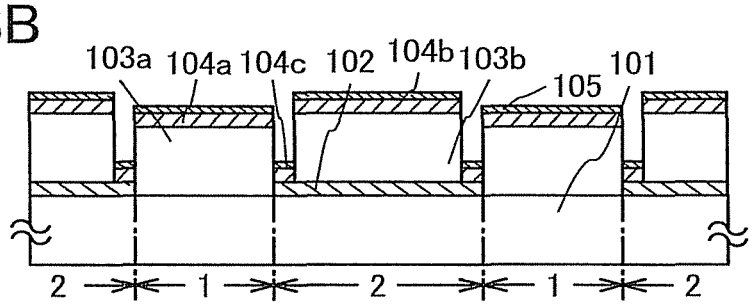

FIG. 3B illustrates a structure in which a light absorption layer is formed over the entire surface of the first region and the second region and is not etched. The light absorption layer is also provided between the first heat-insulating layer 103a and the second heat-insulating layer 103b. Even when the light absorption layer is thus formed over the entire surface, a deposition region has unevenness due to the first heat-insulating layer 103a and the second heat-insulating layer 103b. Accordingly, the light absorption layer is not continuously deposited, but is divided between the first region and the second region.

Even when the second light absorption layer 104b and the third light absorption layer 104c are provided in the second region, they are not irradiated with light because the emitted light is reflected by the reflective layer 102. Thus, heat is not generated in the second light absorption layer 104b and the third light absorption layer 104c; therefore, heat necessary for deposition is not supplied to the organic compound-containing layer over the second light absorption layer 104b and the third light absorption layer 104c.

Figure 3C:
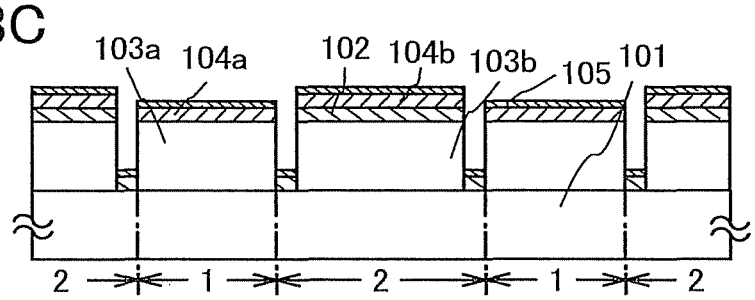
Figure 3D:
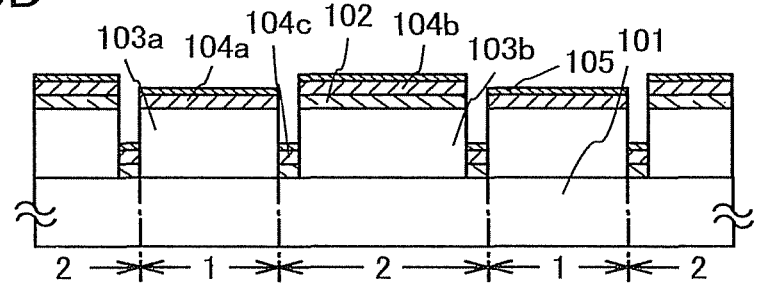

FIGS. 3C and 3D each illustrate an example in which the second heat-insulating layer 103b is formed over the first substrate 101 and then the reflective layer 102 is formed thereover. The first heat-insulating layer 103a and the second heat-insulating layer 103b are formed over the first substrate 101 so as to be separated from each other, and the reflective layer 102 is formed over the second heat-insulating layer 103b in the second region. Then, the light absorption layers are formed in the first region and the second region, and the organic compound-containing layer 105 is formed thereover. FIG. 3C illustrates an example in which the first light absorption layer 104a and the second light absorption layer 104b are selectively formed over the first heat-insulating layer 103a and the second heat-insulating layer 103b, respectively. FIG. 3D illustrates an example in which the light absorption layer is formed over the entire surface of the first region and the second region, so that the third light absorption layer 104c is provided between the first heat-insulating layer 103a and the second heat-insulating layer 103b. The etching step of the light absorption layer is not needed in the structures illustrated in FIGS. 3B and 3D, resulting in process simplification.

FIGS. 4A to 4E each illustrate a structure in which a third heat-insulating layer 112 is further provided over the second heat-insulating layer 103b. FIGS. 4A to 4D correspond to FIGS. 3A to 3D, respectively, and FIG. 4E corresponds to FIG. 1A.

Figure 4A:
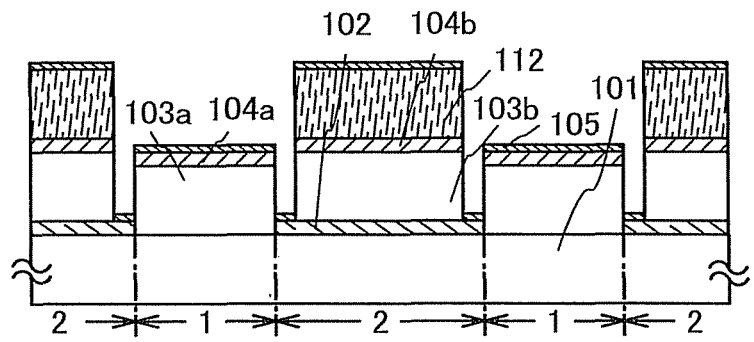
FIGS. 4A to 4E are cross-sectional views illustrating an example of a deposition substrate of the present invention.
Figure 4B:
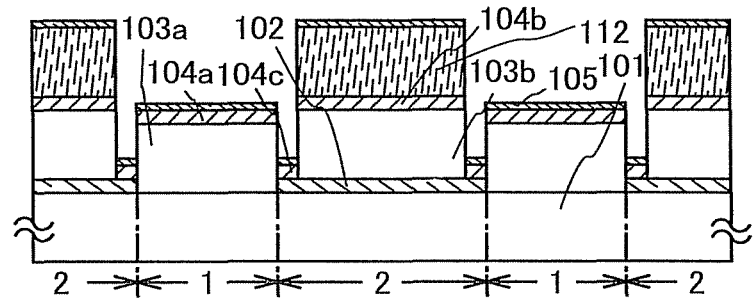

In FIGS. 4A and 4B, the third heat-insulating layer 112 is provided over the second light absorption layer 104b in the second region, and the reflective layer 102, the second heat-insulating layer 103b, the second light absorption layer 104b, the third heat-insulating layer 112, and the organic compound-containing layer 105 are stacked in this order.

Figure 4C:
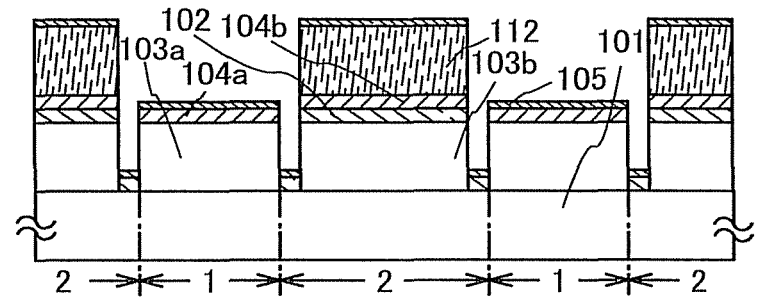
Figure 4D:
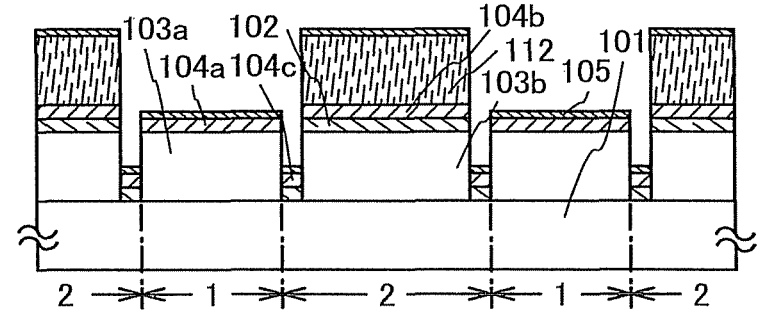

In FIGS. 4C and 4D, the third heat-insulating layer 112 is provided over the second light absorption layer 104b in the second region, and the second heat-insulating layer 103b, the reflective layer 102, the second light absorption layer 104b, the third heat-insulating layer 112, and the organic compound-containing layer 105 are stacked in this order.

Figure 4E:
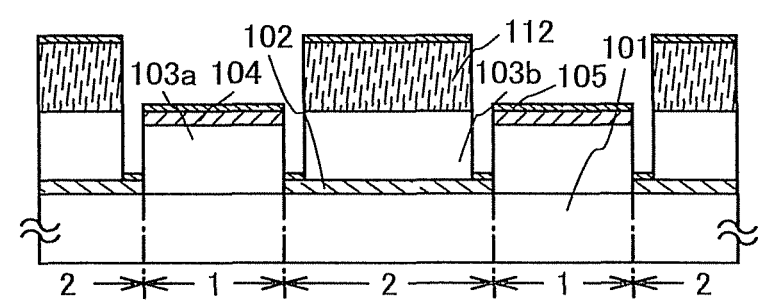

In FIG. 4E, the third heat-insulating layer 112 is provided over the second heat-insulating layer 103b in the second region, and the reflective layer 102, the second heat-insulating layer 103b, the third heat-insulating layer 112, and the organic compound-containing layer 105 are stacked in this order.

When the third heat-insulating layer 112 is provided over the second heat-insulating layer 103b in the second region as illustrated in FIGS. 4A to 4E, the heat conduction path from the light absorption layer in the first region to the organic compound-containing layer 105 in the second region is further increased. Thus, heat generated in the light absorption layer in the first region is dissipated before reaching the organic compound-containing layer 105. Accordingly, a fine pattern can be deposited while preventing deformed patterns more in deposition. Note that the material and deposition method of the third heat-insulating layer 112 may be similar to those of the first heat-insulating layer 103a and the second heat-insulating layer 103b. However, the transmittance of the material of the third heat-insulating layer 112, unlike the first heat-insulating layer 103a, is not particularly limited. In addition, the third heat-insulating layer 112 can be made to function as a spacer to control the distance between the deposition substrate and the deposition-target substrate when the third heat-insulating layer 112 is placed facing the deposition substrate.

FIGS. 18A to 18C, FIGS. 19A to 19D, and FIGS. 20A to 20C each illustrate an example in which a first heat-insulating layer and a second heat-insulating layer are formed by processing the first substrate. Thus, the first heat-insulating layer and the second heat-insulating layer are projections on the surface of the first substrate, which are parts of the first substrate and considered to be a first heat-insulating layer region and a second heat-insulating layer region. In this specification, the first heat-insulating layer region and the second heat-insulating layer region that are parts of the first substrate are also referred to as the first heat-insulating layer and the second heat-insulating layer, respectively.

Figure 18A:
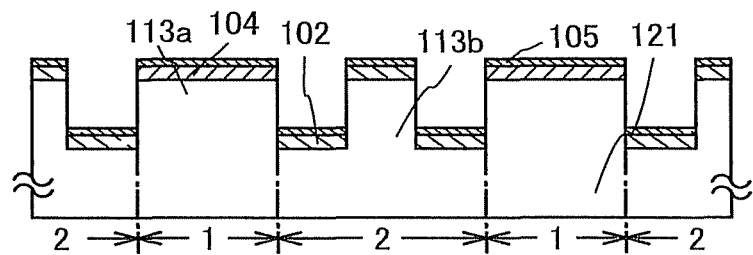
FIGS. 18A to 18C are cross-sectional views each illustrating an example of a deposition substrate of the present invention.
Figure 18B:
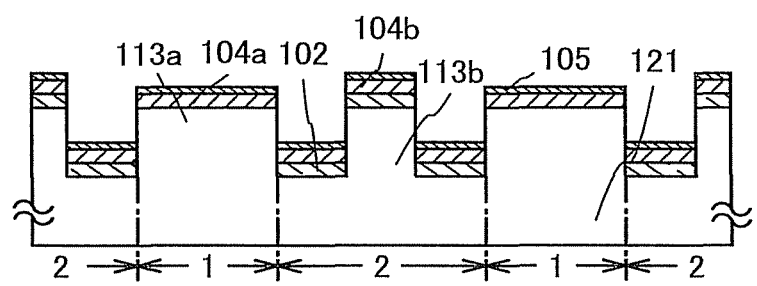
Figure 18C:
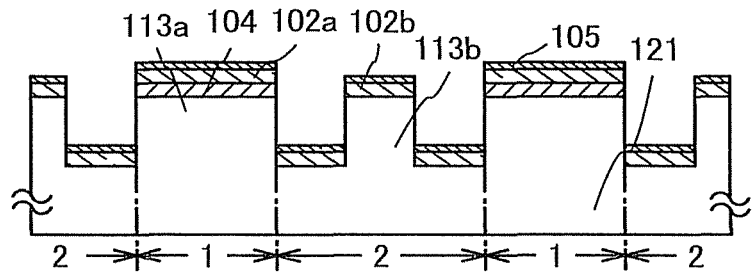

In FIGS. 18A to 18C, the first substrate 121 is etched to faun a first heat-insulating layer 113a and a second heat-insulating layer 113b as projections on the surface of the first substrate 121. In FIG. 18A, the light absorption layer 104 is formed over the first heat-insulating layer 113a in the first region, and the reflective layer 102 is formed over the second heat-insulating layer 113b in the second region.

FIG. 18B illustrates an example in which the light absorption layer is also formed in the second region. In the first region, the first light absorption layer 104a is formed over the first heat-insulating layer 113a, and in the second region, the second light absorption layer 104b is formed over the second heat-insulating layer 113b and the reflective layer 102.

FIG. 18C illustrates an example in which the reflective layer is also formed in the first region. In the first region, a first reflective layer 102a is formed over the first heat-insulating layer 113a and the light absorption layer 104, and in the second region, a second reflective layer 102b is formed over the second heat-insulating layer 113b. Even when the reflective layer is thus formed in the first region, heat generated in the light absorption layer can be supplied to the organic compound-containing layer if the light absorption layer is formed before the reflective layer is formed so as to absorb light.

Figure 19A:
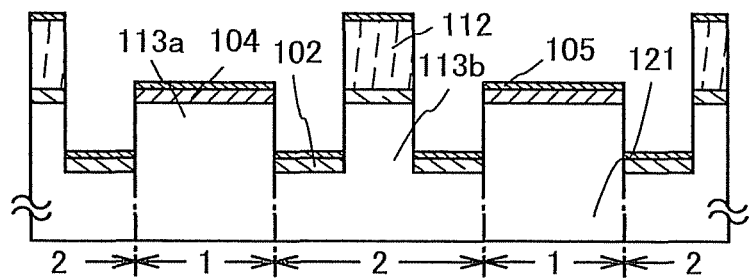
FIGS. 19A to 19D are cross-sectional views each illustrating an example of a deposition substrate of the present invention.
Figure 19B:
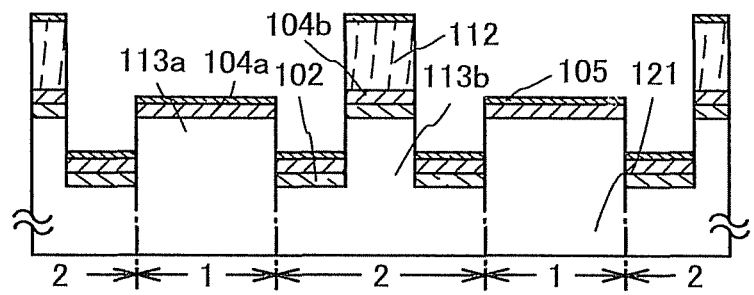
Figure 19C:
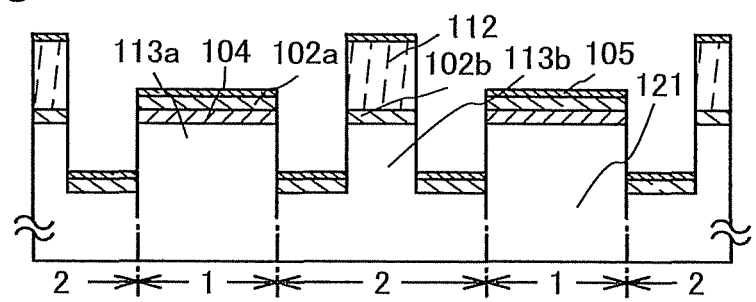

FIGS. 19A to 19D each illustrate an example in which the third heat-insulating layer 112 is provided over the second heat-insulating layer 113b. FIGS. 19A to 19C correspond to FIGS. 18A to 18C, respectively.

In FIG. 19A, the third heat-insulating layer 112 is provided over the reflective layer 102 in the second region, and the second heat-insulating layer 113b, the reflective layer 102, the third heat-insulating layer 112, and the organic compound-containing layer 105 are stacked in this order.

In FIG. 19B, the third heat-insulating layer 112 is provided over the second light absorption layer 104b in the second region, and the second heat-insulating layer 113b, the reflective layer 102, the second light absorption layer 104b, the third heat-insulating layer 112, and the organic compound-containing layer 105 are stacked in this order.

In FIG. 19C, the third heat-insulating layer 112 is provided over the second reflective layer 102b in the second region, and the second heat-insulating layer 113b, the second reflective layer 102b, the third heat-insulating layer 112, and the organic compound-containing layer 105 are stacked in this order.

Figure 19D:
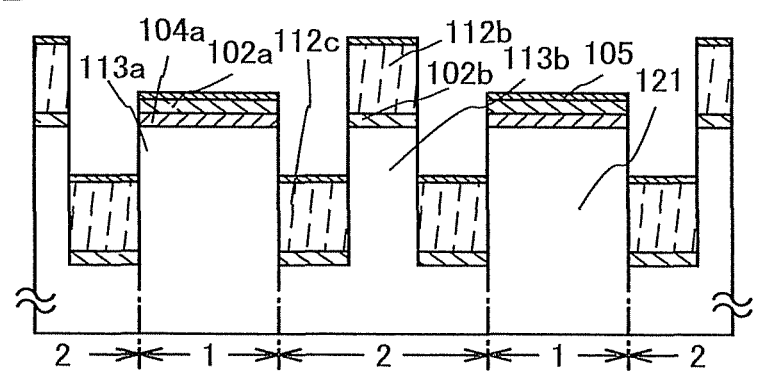

FIG. 19D illustrates an example in which the opening (the distance) between the first heat-insulating layer 113a and the second heat-insulating layer 113b is increased in the thickness direction of the first substrate 121, and a third heat-insulating layer 112c is formed between the first heat-insulating layer 113a and the second heat-insulating layer 113b. In FIG. 19D, the third heat-insulating layer 112b and a third heat-insulating layer 112c are formed in the second region.

Figure 20A:
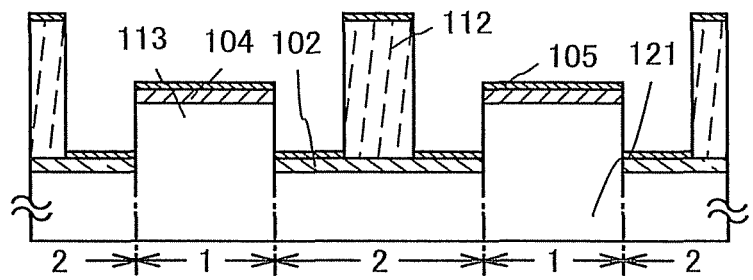
FIGS. 20A to 20C are cross-sectional views each illustrating an example of a deposition substrate of the present invention.
Figure 20B:
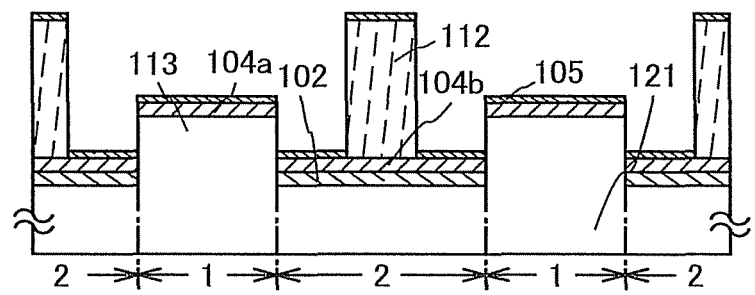
Figure 20C:
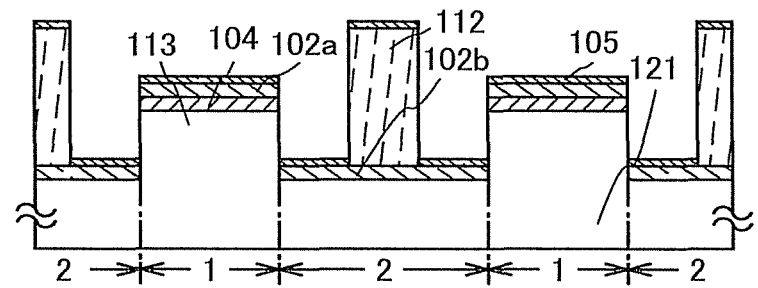

FIGS. 20A to 20C each illustrate an example in which the second heat-insulating layer is not formed over the first substrate 121 in the second region, and the third heat-insulating layer 112 is provided over the reflective layer.

In FIG. 20A, a heat-insulating layer 113 is provided over the first substrate 121 in the first region. In the second region, the third heat-insulating layer 112 is formed over the reflective layer 102 so as to have a distance from the heat-insulating layer 113.

In FIG. 20B, the heat-insulating layer 113 is provided over the first substrate 121 in the first region. In the second region, the third heat-insulating layer 112 is formed over the reflective layer 102 and the second light absorption layer 104b so as to have a distance from the heat-insulating layer 113.

In FIG. 20C, the heat-insulating layer 113 is provided over the first substrate 121 in the first region. In the second region, the third heat-insulating layer 112 is formed over the second reflective layer 102b so as to have a distance from the heat-insulating layer 113.

When the deposition substrates illustrated in FIGS. 3A to 3D, FIGS. 4A to 4E, FIGS. 18A to 18C, FIGS. 19A to 19D, and FIGS. 20A to 20C are irradiated with light in a manner similar to that shown in Embodiment Mode 1, a film can be deposited in a desired pattern on a deposition-target substrate. Accordingly, effects similar to those of Embodiment Mode 1 can be obtained using the deposition substrates shown in this embodiment mode.

In the present invention, a thin film can be formed in a fine pattern on a deposition-target substrate without providing a mask between a material and the deposition-target substrate.

Embodiment Mode 3

In this embodiment mode, a method for manufacturing a light-emitting device capable of full-color display will be described, which is realized by forming EL layers of light-emitting elements with the use of a plurality of the deposition substrates described in Embodiment Modes 1 and 2.

In the present invention, in one deposition process, EL layers made of the same material can be formed on a plurality of electrodes formed on the second substrate that is a deposition-target substrate. Also in the present invention, an EL layer emitting one of the three different colors can be formed on a plurality of electrodes formed on the second substrate, whereby a light-emitting device capable of full-color display can be manufactured.

First, three deposition substrates that are illustrated in, for example, FIG. 1A in Embodiment Mode 1 are prepared. Each deposition substrate includes an organic compound-containing layer for forming an EL layer emitting a different color. Specifically, the following substrates are prepared: a first deposition substrate including an organic compound-containing layer (R) for forming an EL layer emitting red light (an EL layer (R)); a second deposition substrate including an organic compound-containing layer (G) for forming an EL layer emitting green light (an EL layer (G)); and a third deposition substrate including an organic compound-containing layer (B) for forming an EL layer emitting blue light (an EL layer (B)).

In addition, one deposition-target substrate including a plurality of first electrodes is prepared. Note that the edges of the plurality of first electrodes on the deposition-target substrate are covered with an insulating layer; thus, a light-emitting region corresponds to part of the first electrode, which does not overlap the insulating layer and is exposed.

As a first deposition process, the deposition-target substrate is placed facing the first deposition substrate and alignment of the substrates is performed in a manner similar to that of FIGS. 1A to 1D. Note that the deposition-target substrate preferably includes an alignment marker. It is preferable that the first deposition substrate also include an alignment marker. Since the first deposition substrate includes a light absorption layer, part of the light absorption layer, which is on the periphery of the alignment marker, is preferably removed in advance. Furthermore, since the first deposition substrate includes the organic compound-containing layer (R), part of the organic compound-containing layer (R), which is on the periphery of the alignment marker, is also preferably removed in advance.

Then, light is emitted from the back surface of the first deposition substrate (the surface that does not include the reflective layer 102, the heat-insulating layer 103, the light absorption layer 104, and the organic compound-containing layer 105 illustrated in FIGS. 1A to 1D). The light absorption layer absorbs the emitted light and supplies heat to the organic compound-containing layer (R) to heat the material contained in the organic compound-containing layer (R), whereby an EL layer (R) is formed on some of the first electrodes on the deposition-target substrate. After the first deposition process is completed, the first deposition substrate is moved away from the deposition-target substrate.

Then, as a second deposition process, the deposition-target substrate is placed facing the second deposition substrate and alignment of the substrates is performed. The second deposition substrate includes a reflective layer having an opening at a position that is shifted by one pixel from the opening of the reflective layer of the first deposition substrate used in the first deposition process.

Then, light is emitted from the back surface of the second deposition substrate (the surface that does not include the reflective layer 102, the heat-insulating layer 103, the light absorption layer 104, and the organic compound-containing layer 105 illustrated in FIGS. 1A to 1D). The light absorption layer absorbs the emitted light and supplies heat to the organic compound-containing layer (G) to heat the material contained in the organic compound-containing layer (G), whereby an EL layer (G) is formed on some of the first electrodes on the deposition-target substrate, which are next to the first electrodes on which the EL layer (R) has been formed in the first deposition process. After the second deposition process is completed, the second deposition substrate is moved away from the deposition-target substrate.

Next, as a third deposition process, the deposition-target substrate is placed facing the third deposition substrate and alignment of the substrates is performed. The third deposition substrate includes a reflective layer having an opening at a position that is shifted by two pixels from the opening of the reflective layer of the first deposition substrate used in the first deposition process.

Figure 10A:
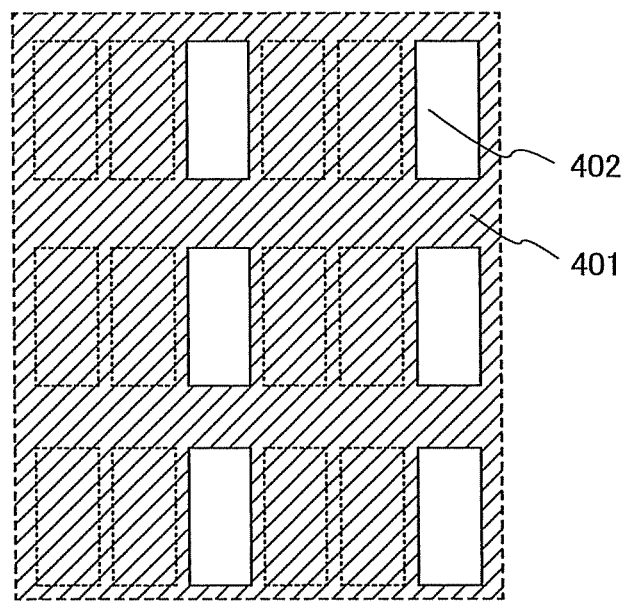
FIGS. 10A and 10B are views illustrating a deposition substrate of the present invention.

Then, light is emitted from the back surface of the third deposition substrate (the surface that does not include the reflective layer 102, the heat-insulating layer 103, the light absorption layer 104, and the organic compound-containing layer 105 illustrated in FIGS. 1A to 1D). The state just before the third deposition process corresponds to a top view of FIG. 10A. In FIG. 10A, a reflective layer 401 includes an opening 402. Accordingly, light passing through the opening 402 of the reflective layer 401 of the third deposition substrate is transmitted through the heat-insulating layer and absorbed by the light absorption layer. In addition, the first electrode is formed in a region of the deposition-target substrate, which overlaps the opening 402 of the third deposition substrate. Note that an EL layer (R) 411 that has been formed in the first deposition process and an EL layer (G) 412 that has been formed in the second deposition process are placed under the regions indicated by dotted lines in FIG. 10A.

Then, an EL layer (B) 413 is formed in the third deposition process. The light absorption layer absorbs the emitted light and supplies heat to the organic compound-containing layer (B) to heat the material contained in the organic compound-containing layer (B), whereby an EL layer (B) 413 is formed on some of the first electrodes on the deposition-target substrate, which are next to the first electrodes on which the EL layer (G) has been formed in the second deposition process. After the third deposition process is completed, the third deposition substrate is moved away from the deposition-target substrate.

In this manner, the EL layer (R) 411, the EL layer (G) 412, and the EL layer (B) 413 can be formed at regular intervals on the same deposition-target substrate. Then, a second electrode is formed over these layers, whereby light-emitting elements can be formed.

Through the above steps, light-emitting elements that emit different colors are formed over the same substrate, whereby a light-emitting device capable of full-color display can be formed.

Figure 10B:
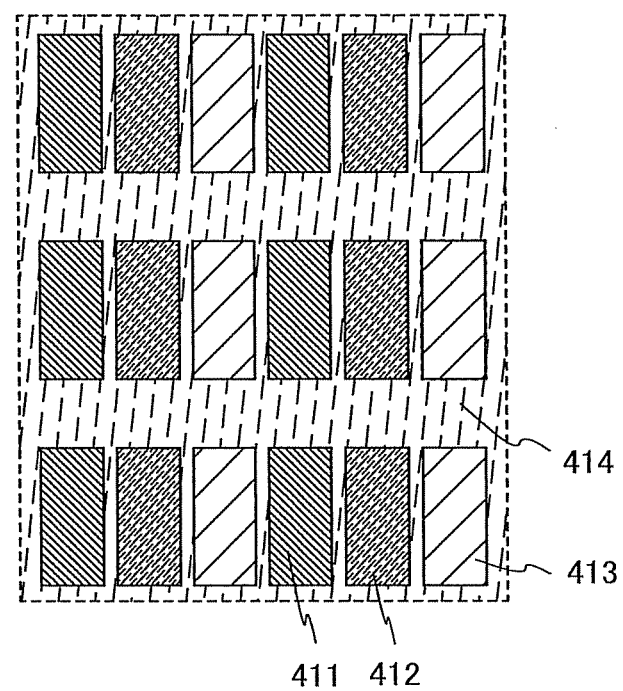

FIGS. 10A and 10B illustrate an example in which the opening 402 of the reflective layer formed over the deposition substrate has a rectangular shape. However, the present invention is not particularly limited to this example and stripe openings may be employed. In the case of the stripe openings, although deposition is also performed between light-emitting regions emitting the same color, the deposition between the light-emitting regions is performed over an insulating layer 414, and thus a portion overlapping the insulating layer 414 does not serve as a light-emitting region.

Figure 11A:
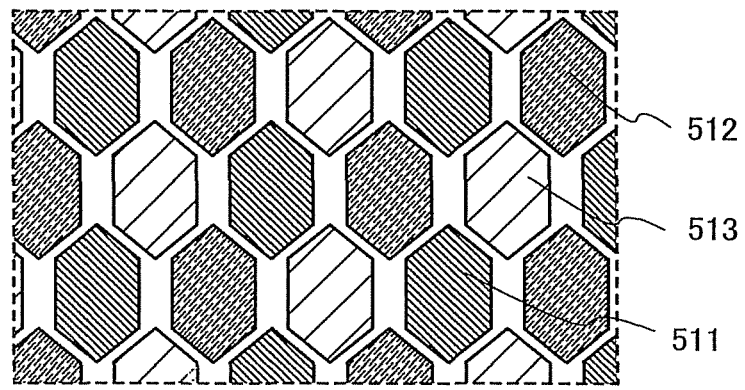
FIGS. 11A and 11B are views illustrating a deposition substrate of the present invention.
Figure 11B:
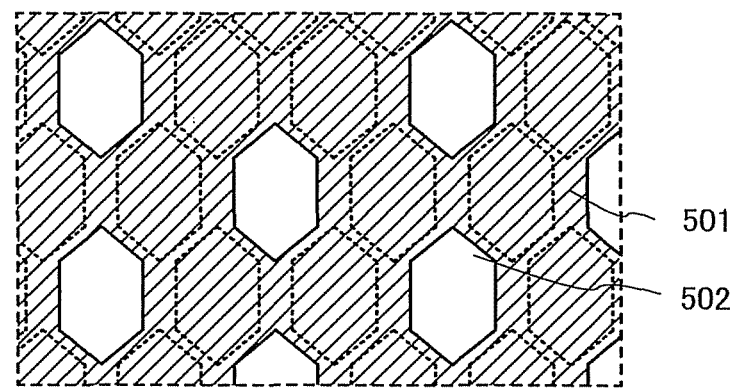

Similarly, there is no particular limitation on the arrangement of the pixels. The shape of each pixel may be a polygon, for example, a hexagon as illustrated in FIG. 11A, and a full-color light-emitting device may be realized by the arrangement of an EL layer (R) 511, an EL layer (G) 512, and an EL layer (B) 513. In order to form the polygonal pixels illustrated in FIG. 11A, deposition may be performed using a deposition substrate illustrated in FIG. 11B, which includes a reflective layer 501 having polygonal openings 502.

In manufacturing the full-color light-emitting device shown in this embodiment mode, the thickness of a film deposited on the deposition-target substrate can be controlled by controlling the thickness of the organic compound-containing layer formed over the deposition substrate. That is, the thickness of the organic compound-containing layer formed over the deposition substrate is controlled in advance so that the film formed on the deposition-target substrate has a desired thickness when all materials contained in the organic compound-containing layer are deposited; therefore, a thickness monitor is not necessary in the deposition on the deposition-target substrate. Accordingly, the practitioner does not need to adjust the deposition rate by using a thickness monitor, and thus the deposition process can be fully automated, resulting in improvement of productivity.

In manufacturing the full-color light-emitting device shown in this embodiment mode, the materials contained in the organic compound-containing layer formed over the deposition substrate can be uniformly deposited by applying the present invention. Even in the case where the organic compound-containing layer contains plural kinds of materials, a film containing the same materials in substantially the same weight ratio as the organic compound-containing layer can be deposited on the deposition-target substrate. Accordingly, even in the case where plural kinds of materials with different deposition temperatures are used for deposition, with the deposition method of the present invention, a desired layer containing different kinds of materials can be deposited easily and accurately without complicated control of the evaporation rate or the like.

By applying the present invention in manufacturing the full-color light-emitting device shown in this embodiment mode, desired materials can be deposited on a deposition-target substrate without being wasted. Thus, material use efficiency can be increased, resulting in reduction in production cost. Furthermore, materials can be prevented from being attached to an inner wall of a deposition chamber, and thus maintenance of the deposition apparatus can be facilitated.

By applying the present invention in manufacturing the full-color light-emitting device shown in this embodiment mode, a flat even film can be deposited. In addition, a fine pattern can be formed, and thus a high-definition light-emitting device can be manufactured.

By applying the present invention, a film can be selectively deposited in a desired region when deposition is performed using light. Thus, material use efficiency can be increased, and a desired shape can be deposited easily and accurately, resulting in improvement of productivity. In addition, since high output power light can be used as a light source in the present invention, a large area can be deposited at a time. Accordingly, time necessary for deposition (takt time) can be reduced, resulting in improvement of productivity.

Note that the structure shown in this embodiment mode can be used in appropriate combination with the structures shown in Embodiment Modes 1 and 2.

Embodiment Mode 4

In this embodiment mode, a method for manufacturing a light-emitting element and a light-emitting device by applying the present invention will be described.

Figure 12A:
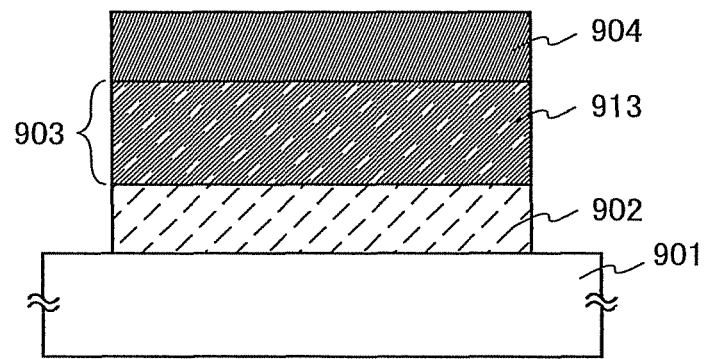
FIGS. 12A and 12B are cross-sectional views each illustrating a structure of a light-emitting element that can be applied to the present invention.
Figure 12B:
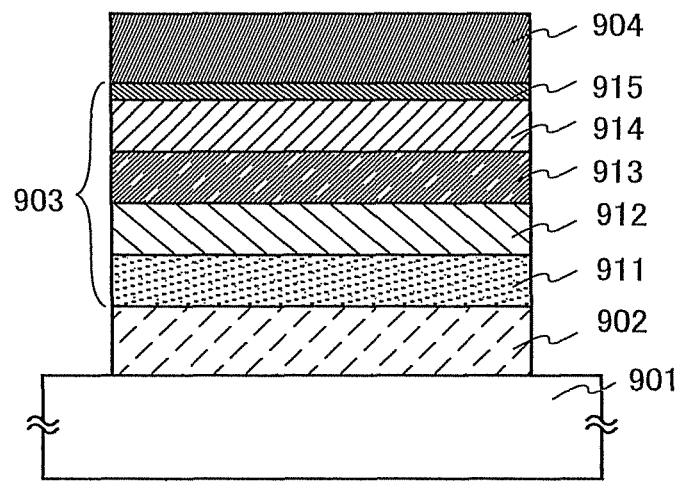

For example, light-emitting elements illustrated in FIGS. 12A and 12B can be manufactured by applying the present invention. In the light-emitting element illustrated in FIG. 12A, a first electrode 902, an EL layer 903 including only a light-emitting layer 913, and a second electrode 904 are stacked in this order over a substrate 901. One of the first electrode 902 and the second electrode 904 functions as an anode, and the other functions as a cathode. Holes injected from the anode and electrons injected from the cathode are recombined in the EL layer 903, whereby light emission can be obtained. In this embodiment mode, the first electrode 902 functions as the anode and the second electrode 904 functions as the cathode.

In the light-emitting element illustrated in FIG. 12B, the EL layer 903 in FIG. 12A has a structure including a plurality of stacked layers. Specifically, a hole-injecting layer 911, a hole-transporting layer 912, the light-emitting layer 913, an electron-transporting layer 914, and an electron-injecting layer 915 are stacked in this order from the first electrode 902 side. Note that the EL layer 903 functions if it includes at least the light-emitting layer 913 as illustrated in FIG. 12A; therefore, not all the above layers are required and may be selected to be provided as appropriate.

As the substrate 901 illustrated in FIGS. 12A and 12B, a substrate having an insulating surface or an insulating substrate is employed. Specifically, it is possible to use a variety of glass substrates used for the electronics industry, such as an aluminosilicate glass substrate, an aluminoborosilicate glass substrate, or a barium borosilicate glass substrate, as well as a quartz substrate, a ceramic substrate, a sapphire substrate, or the like.

For the first electrode 902 and the second electrode 904, various types of metals, alloys, electrically conductive compounds, mixtures thereof, and the like can be used. Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide, or the like can be used. It is also possible to use gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), or the like.

Films of those materials are generally deposited by sputtering. For example, a film of indium oxide-zinc oxide can be formed by sputtering using a target in which zinc oxide is added to indium oxide at 1 wt % to 20 wt %. A film of indium oxide containing tungsten oxide and zinc oxide can be formed by sputtering using a target in which tungsten oxide and zinc oxide are added to indium oxide at 0.5 wt % to 5 wt % and 0.1 wt % to 1 wt %, respectively. Furthermore, films of those materials may be fondled by ink-jet, spin coating, or the like by application of a sol-gel process or the like.

Alternatively, aluminum (Al), silver (Ag), an alloy containing aluminum, or the like can be used. It is also possible to use an element belonging to Group 1 or Group 2 of the periodic table, which has a low work function, that is, an alkali metal such as lithium (Li) or cesium (Cs), an alkaline earth metal such as magnesium (Mg), calcium (Ca), or strontium (Sr), or an alloy containing these elements (e.g., an alloy of aluminum, magnesium, and silver, or an alloy of aluminum and lithium); or a rare earth metal such as europium (Eu) or ytterbium (Yb), or an alloy thereof.

A film of an alkali metal, an alkaline earth metal, or an alloy containing such a metal can be formed by vacuum evaporation. An alloy film containing an alkali metal or an alkaline earth metal can also be formed by sputtering. Alternatively, silver paste or the like can be deposited by ink-jet or the like. The first electrode 902 and the second electrode 904 each are not limited to a single layer film, and may be a stacked-layer film.

In order to extract light emitted from the EL layer 903 to the outside, one or both of the first electrode 902 and the second electrode 904 are formed so as to transmit light. For example, one or both of the first electrode 902 and the second electrode 904 are formed of a conductive material having a light-transmitting property, such as indium tin oxide, or formed of silver, aluminum, or the like to a thickness of several nanometers to several tens of nanometers. Alternatively, one or both of the first electrode 902 and the second electrode 904 can have a stacked-layer structure including a thin film of a metal such as silver or aluminum and a thin film of a conductive material having a light-transmitting property, such as ITO.

The EL layer 903 (the hole-injecting layer 911, the hole-transporting layer 912, the light-emitting layer 913, the electron-transporting layer 914, or the electron-injecting layer 915) of the light-emitting element shown in this embodiment mode can be formed by applying the deposition method described in Embodiment Mode 1. In addition, the electrodes can also be formed by applying the deposition method described in Embodiment Mode 1.

A variety of materials can be used for the light-emitting layer 913. For example, a fluorescent compound that exhibits fluorescence or a phosphorescent compound that exhibits phosphorescence can be used.

Examples of a phosphorescent compound that can be used for the light-emitting layer 913 are given below. As a light-emitting material for blue emission, there are bis[2-(4',6'-difluorophenyl)pyridinato-N,$C^{2'}$]iridium(III)tetrakis(1-pyrazolyl)borate (FIr6), bis[2-(4',6'-difluorophenyl)pyridinato-N,$C^{2'}$]iridium(III)picolinate (FIrpic), bis[2-(3',5'-bistrifluoromethylphenyl)pyridinato-N,$C^{2'}$]iridium(III) picolinate (Ir($CF_3$ppy)$_2$(pic)), bis[2-(4',6'-difluorophenyl)pyridinato-N,$C^{2'}$]iridium(III)acetylacetonate (FIracac), and the like. As a light-emitting material for green emission, there are tris(2-phenylpyridinato-N,$C^{2'}$)iridium(III) (Ir(ppy)$_3$), bis(2-phenylpyridinato-N,$C^{2'}$)iridium(III)acetylacetonate (Ir(ppy)$_2$(acac)), bis(1,2-diphenyl-1H-benzimidazolato)iridium(III)acetylacetonate (Ir(pbi)$_2$(acac)), bis(benzo[h]quinolinato)iridium(III)acetylacetonate (Ir(bzq)$_2$(acac)), and the like. As a light-emitting material for yellow emission, there are bis(2,4-diphenyl-1,3-oxazolato-N,$C^{2'}$)iridium(III) acetylacetonate (Ir(dpo)$_2$(acac)), bis[2-(4'-(perfluorophenylphenyl)pyridinato]iridium(III)acetylacetonate (Ir(p-PF-ph)$_2$(acac)), bis(2-phenylbenzothiazolato-N,$C^{2'}$)iridium(III) acetylacetonate (Ir(bt)$_2$(acac)), and the like. As a light-emitting material for orange emission, there are tris(2- phenylquinolinato-N,C$^{2'}$)iridium(III) (Ir(pq)$_3$), bis(2-phenylquinolinato-N,C$^{2'}$)iridium(III)acetylacetonate (Ir(pq)$_2$(acac)), and the like. As a light-emitting material for red emission, there are organic metal complexes such as bis[2-(2'-benzo[4,5-α]thienyl)pyridinato-N,C$^{3'}$)iridium(III)acetylacetonate (Ir(btp)$_2$(acac)), bis(1-phenylisoquinolinato-N,C$^{2'}$)iridium(III)acetylacetonate (Ir(piq)$_2$(acac), (acetylacetonato)bis[2,3-bis(4-fluorophenyl)quinoxalinato]iridium(III) (Ir(Fdpq)$_2$(acac)), and 2,3,7,8,12,13,17,18-octaethyl-21H,23H-porphine platinum(II) (PtOEP). In addition, rare earth metal complexes such as tris(acetylacetonato)(monophenanthroline)terbium(III) (Tb(acac)$_3$(Phen)), tris(1,3-diphenyl-1,3-propanedionato)(monophenanthroline)europium(III) (Eu(DBM)$_3$(Phen)), and tris[1-(2-thenoyl)-3,3,3-trifluoroacetonato](monophenanthroline)europium(III) (Eu(TTA)$_3$(Phen)) emit light from a rare earth metal ion (electron transition between different multiplicities); therefore, such rare earth metal complexes can be used as phosphorescent compounds.

Examples of a fluorescent compound that can be used for the light-emitting layer 913 are given below. As a light-emitting material for blue emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and the like. As a light-emitting material for green emission, there are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)-N-[4-(9H-carbazol-9-yl)phenyl]-N-phenylanthracene-2-ami ne (2YGABPhA), N,N,9-triphenylanthracene-9-amine (DPhAPhA), and the like. As a light-emitting material for yellow emission, there are rubrene, 5,12-bis(1,1'-biphenyl-4-yl)-6,11-diphenyltetracene (BPT), and the like. As a light-emitting material for red emission, there are N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-d iamine (p-mPhAFD), and the like.

The light-emitting layer 913 may have a structure in which a substance having a high light-emitting property (a dopant material) is dispersed in another substance (a host material), whereby crystallization of the light-emitting layer can be suppressed. In addition, concentration quenching due to high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

As the host material used for the light-emitting layer 913, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material, any of the aforementioned phosphorescent compounds and fluorescent compounds can be used.

When the light-emitting layer 913 has a structure in which a substance having a high light-emitting property (a dopant material) is dispersed in another substance (a host material), a mixed layer of a host material and a guest material is formed as the organic compound-containing layer over the deposition substrate. Alternatively, the organic compound-containing layer over the deposition substrate may have a stacked structure of a layer containing a host material and a layer containing a dopant material. By forming the light-emitting layer 913 using the deposition substrate provided with the organic compound-containing layer having such a structure, the light-emitting layer 913 contains a substance in which a light-emitting material is dispersed (a host material) and a substance having a high light-emitting property (a dopant material), and has a structure in which the substance having a high light-emitting property (the dopant material) is dispersed in the substance in which a light-emitting material is dispersed (the host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 12B is formed, the deposition substrates shown in Embodiment Mode 1, each of which has an organic compound-containing layer formed of a material for forming each layer in the EL layer 903 (the hole-injecting layer 911, the hole-transporting layer 912, the light-emitting layer 913, the electron-transporting layer 914, and the electron-injecting layer 915) are prepared for the respective layers, and deposition of each layer is performed using a different deposition substrate by the method shown in Embodiment Mode 1, whereby the EL layer 903 can be formed over the first electrode 902 over the substrate 901. Then, the second electrode 904 is formed over the EL layer 903, and thus the light-emitting element illustrated in FIG. 12B can be obtained. Although all the layers in the EL layer 903 can be formed by the method shown in Embodiment Mode 1 in that case, only some of the layers in the EL layer 903 may be formed by the method shown in Embodiment Mode 1.

In the case where films are stacked over a deposition-target substrate by a wet process, a liquid composition containing a material is directly attached to a lower film, and thus the lower film is dissolved depending on a solvent contained in the composition; therefore, materials that can be stacked are limited. However, in the case where films are stacked by the deposition method of the present invention, there is no need to consider the effect of the solvent on the lower film because the solvent is not directly attached to the lower film. Accordingly, the present invention increases the flexibility of materials that can be stacked. If a film is directly formed on a deposition-target substrate by a wet process, heat treatment needs to be performed under conditions that do not affect the lower film that has been deposited on the deposition-target substrate; therefore, film quality cannot be sufficiently improved in some cases.

The hole-injecting layer 911 can be formed of molybdenum oxide, vanadium oxide, ruthenium oxide, tungsten oxide, manganese oxide, or the like. Alternatively, the hole-injecting layer 911 can be formed of a phthalocyanine-based compound such as phthalocyanine (H$_2$Pc) or copper phthalocyanine (CuPc), a high molecular compound such as poly(3,4-ethylenedioxythiophene)/poly(styrenesulfonic acid) (PEDOT/PSS), or the like.

As the hole-injecting layer 911, a layer that contains a substance having a high hole-transporting property and a substance having an electron-accepting property can be used. The layer that contains a substance having a high hole-transporting property and a substance having an electron-accepting property has a high carrier density and an excellent hole-injecting property. When the layer that contains a substance having a high hole-transporting property and a substance having an electron-accepting property is used as a hole-injecting layer that is in contact with an electrode functioning as an anode, a variety of metals, alloys, electrically conductive compounds, mixtures thereof, and the like can be used for the electrode regardless of the magnitude of work function of a material of the electrode functioning as an anode.

As the substance having an electron-accepting property, which is used for the hole-injecting layer 911, 7,7,8,8-tetracyano-2,3,5,6-tetrafluoroquinodimethane (F4-TCNQ), chloranil, and the like can be used. Alternatively, a transition metal oxide can also be used. Still other examples are oxides of a metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferably used because of their high electron accepting properties. Among them, molybdenum oxide is especially preferable because it is stable even in the air, has a low hygroscopic property, and is easy to be handled.

As the substance having a high hole-transporting property, which is used for the hole-injecting layer 911, various compounds such as an aromatic amine compound, a carbazole derivative, an aromatic hydrocarbon, and a high molecular compound (such as oligomer, dendrimer, and polymer) can be used. Note that it is preferable that the substance having a high hole-transporting property used for the hole-injecting layer be a substance having a hole mobility of $10^{-6}$ cm$^2$/Vs or more. Note that any other substances may also be used as long as the hole-transporting properties thereof are higher than the electron-transporting properties thereof. Specific examples of the substance having a high hole-transporting property, which can be used for the hole-injecting layer 911, are given below.

As the aromatic amine compound that can be used for the hole-injecting layer 911, there are 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), and the like. In addition, there are also N,N'-bis(4-methylphenyl)(p-tolyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

As the carbazole derivative that can be used for the hole-injecting layer 911, specifically, 3-[N-(9-phenylcarbazol-3-yl)-N-phenylamino]-9-phenylcarbazole (PCzPCA1), 3,6-bis[N-(9-phenylcarbazol-3-yl)-N-phenyl amino]-9-phenylcarbazole (PCzPCA2), 3-[N-(1-naphthyl)-N-(9-phenylcarbazol-3-yl)amino]-9-phenylcarbazole (PCzPCN1), and the like can be used.

In addition, as the carbazole derivative that can be used for the hole-injecting layer 911, there are also 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4(N-carbazolyl)phenyl]-2,3,5,6-tetraphenylbenzene, and the like.

As the aromatic hydrocarbon that can be used for the hole-injecting layer 911, there are 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can also be used. As described above, an aromatic hydrocarbon having a hole mobility of $1 \times 10^{-6}$ cm$^2$/Vs or more and having 14 to 42 carbon atoms is more preferably used.

The aromatic hydrocarbon that can be used for the hole-injecting layer 911 may have a vinyl skeleton. As the aromatic hydrocarbon having a vinyl skeleton, there are 4,4'-bis(2,2-diphenylvinyl)biphenyl (DPVBi), 9,10-bis[4-(2,2-diphenylvinyl)phenyl]anthracene (DPVPA), and the like.

Since the layer that contains a substance having a high hole-transporting property and a substance having an electron-accepting property is excellent not only in hole-injecting properties but also in hole-transporting properties, and thus the aforementioned hole-injecting layer 911 may be used as the hole-transporting layer.

The hole-transporting layer 912 contains a substance having a high hole-transporting property. As the substance having a high hole-transporting property, there are aromatic amine compounds such as 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino]triphenylamine (MTDATA), and 4,4'-bis[N-(spiro-9,9'-bifluoren-2-yl)-N-phenylamino]biphenyl (BSPB), and the like. The substances described here are mainly substances having a hole mobility of $10^{-6}$ cm$^2$/Vs or more. Note that any other substances may also be used as long as the hole-transporting properties thereof are higher than the electron-transporting properties thereof. Note that the layer that contains a substance having a high hole-transporting property is not limited to a single layer, but may be a stack of two or more layers that contain the aforementioned substances.

The electron-transporting layer 914 contains a substance having a high electron-transporting property. As the substance having a high electron-transporting property, there are metal complexes having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]quinolinato)beryllium (BeBq$_2$), and bis(2-methyl-8-quinolinolato)(4-phenylphenolato)aluminum (BAlq). Alternatively, metal complexes having an oxazole-based ligand or a thiazole-based ligand, such as bis[2-(2-hydroxyphenyl)benzoxazolato]zinc (Zn(BOX)$_2$) and bis[2-(2-hydroxyphenyl)benzothiazolato]zinc (Zn(BTZ)$_2$) can be used. Furthermore, besides the metal complexes, 2-(4-biphenylyl)-5-(4-tert-butylphenyl)-1,3,4-oxadiazole (PBD), 1,3- bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), or the like can also be used. The substances described here are mainly substances having a hole mobility of $10^{-6}$ cm$^2$/Vs or more. Note that any other substances may also be used as long as the electron-transporting properties thereof are higher than the hole-transporting properties thereof. In addition, the electron-transporting layer is not limited to a single layer, but may be a stack of two or more layers that contain the aforementioned substances.

As the electron-injecting layer 915, an alkali metal compound or an alkaline earth metal compound, such as lithium fluoride (LiF), cesium fluoride (CsF), or calcium fluoride (CaF$_2$) can be used. Alternatively, a layer in which a substance having an electron-transporting property is combined with an alkali metal or an alkaline earth metal can be used. For example, a layer made of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode 904.

Note that there is no particular limitation on a stacked-layer structure of the EL layer 903. The EL layer 903 may be formed by an appropriate combination of a light-emitting layer with a layer formed of a substance having a high electron-transporting property, a substance having a high hole-transporting property, a substance having a high electron-injecting property, a substance having a high hole-injecting property, a bipolar substance (a substance having high electron and hole-transporting properties), or the like.

Light emission from the EL layer 903 is extracted to the outside through one or both of the first electrode 902 and the second electrode 904. Therefore, one or both of the first electrode 902 and the second electrode 904 are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 through the second electrode 904. In the case where both the first electrode 902 and the second electrode 904 are electrodes having a light-transmitting property, light is extracted from both the substrate 901 side and the side opposite to the substrate 901 through the first electrode 902 and the second electrode 904, respectively.

Note that, although FIGS. 12A and 12B illustrate the structure in which the first electrode 902 functioning as an anode is provided on the substrate 901 side, the second electrode 904 functioning as a cathode may be provided on the substrate 901 side.

The EL layer 903 may be formed by the deposition method shown in Embodiment Mode 1 or may be formed by a combination of the deposition method shown in Embodiment Mode 1 with another deposition method. A different deposition method may be used to form each electrode or each layer. As a dry process, there are vacuum evaporation, electron beam evaporation, sputtering, and the like. As a wet process, there are ink-jet, spin coating, and the like.

In the light-emitting element of this embodiment mode, an EL layer can be formed by applying the present invention, and thus a highly accurate film can be formed efficiently. Therefore, not only improvement in characteristics of the light-emitting element, but also improvement in yield and reduction in cost can be achieved.

This embodiment mode can be combined with any of Embodiment Modes 1 to 3 as appropriate.

Embodiment Mode 5

In this embodiment mode, a passive matrix light-emitting device manufactured by the present invention will be described with reference to FIGS. 5A and 5B, FIGS. 6A and 6B, FIGS. 7A to 7D, FIGS. 8A to 8C, and FIGS. 9A to 9D.

Figure 5A:
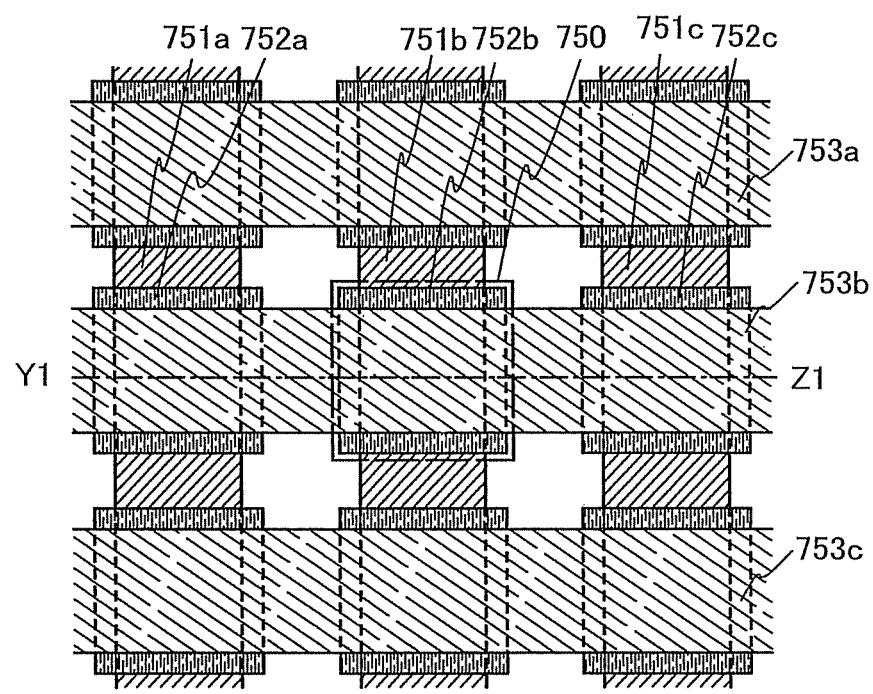
FIGS. 5A and 5B are respectively a plan view and a cross-sectional view illustrating a light-emitting device of the present invention.
Figure 5B:
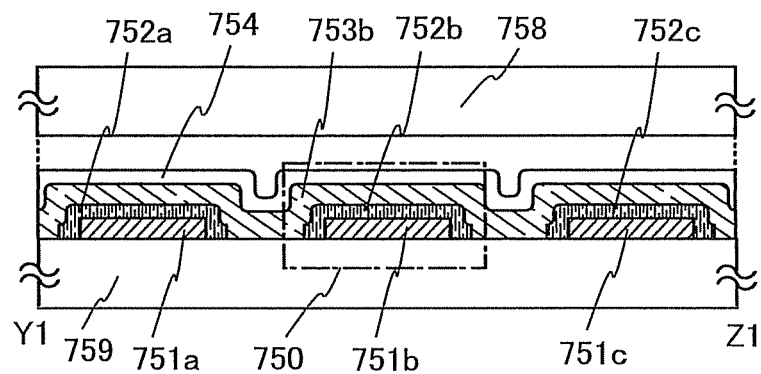

FIGS. 5A and 5B illustrate a light-emitting device including a passive matrix light-emitting element to which the present invention is applied. FIG. 5A is a plan view of the light-emitting device and FIG. 5B is a cross-sectional view taken along line Y1-Z1 of FIG. 5A.

In the light-emitting device of FIG. 5A, first electrode layers 751a, 751b, and 751c extending in a first direction, which are used for the light-emitting elements; EL layers 752a, 752b, and 752c that are selectively formed over the first electrode layers 751a, 751b, and 751c, respectively; and second electrode layers 753a, 753b, and 753c extending in a second direction perpendicular to the first direction, which are used for the light-emitting elements, are formed over an element substrate 759. An insulating layer 754 functioning as a protective film is provided to cover the second electrode layers 753a, 753b, and 753c (see FIGS. 5A and 5B).

In FIGS. 5A and 5B, the first electrode layer 751b functioning as a data line (a signal line) and the second electrode layer 753b functioning as a scan line (a source line) cross each other with the EL layer 752b interposed therebetween, so that a light-emitting element 750 is formed.

In this embodiment mode, the EL layers 752a, 752b, and 752c are formed by the deposition method of the present invention shown in Embodiment Mode 1. The method for manufacturing the light-emitting device of this embodiment mode illustrated in FIGS. 5A and 5B will be described with reference to FIGS. 7A to 7D.

Figure 7A:
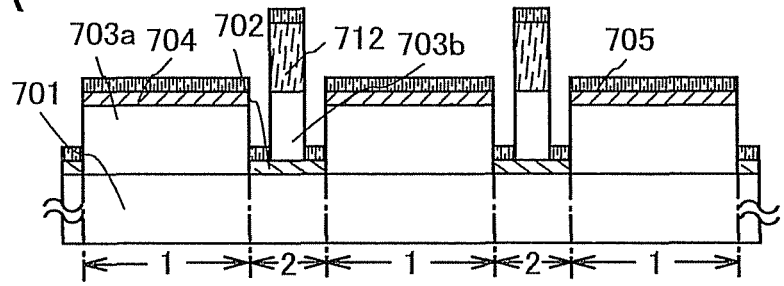
FIGS. 7A to 7D are cross-sectional views illustrating manufacturing steps of a light-emitting device of the present invention.

A deposition substrate illustrated in FIG. 7A has a structure similar to that of FIG. 4E shown in Embodiment Mode 1. In the first region of the deposition substrate, a first heat-insulating layer 703a and a light absorption layer 704 are stacked in this order over a substrate 701. In the second region, a reflective layer 702, a second heat-insulating layer 703b, and a third heat-insulating layer 712 are stacked in this order over the substrate 701. An organic compound-containing layer 705 is formed as the uppermost layer of the deposition substrate.

Figure 7B:
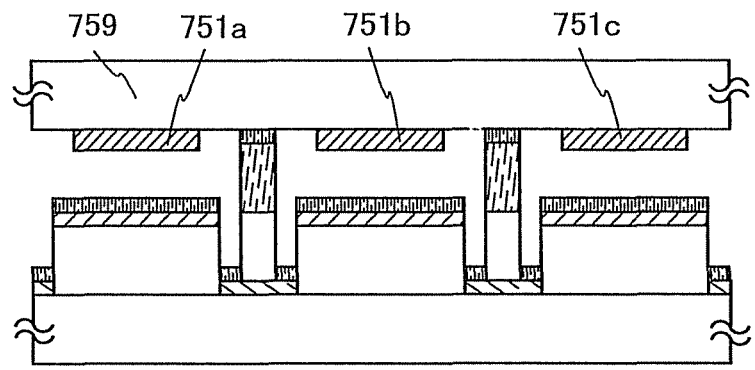

First electrode layers 751a, 751b, and 751c are formed on an element substrate 759 that is a deposition-target substrate. The element substrate 759 and the substrate 701 are placed so that the first electrode layers 751a, 751b, and 751c face the organic compound-containing layer 705 (see FIG. 7B). When the second heat-insulating layer 703b and the third heat-insulating layer 712 are formed to function as a spacer and the deposition substrate and the deposition-target substrate are provided in contact with each other as illustrated in FIG. 7B, the pixel region in each first region can be separated from other pixel regions. Accordingly, a material evaporated from the organic compound-containing layer by light irradiation can be prevented from being attached to the other pixel regions.

Figure 7C:
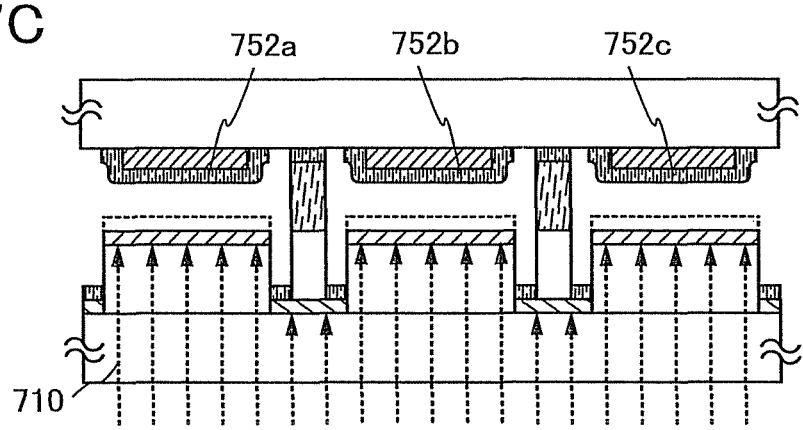

Light 710 is emitted from the back surface of the substrate 701 (the surface that does not include the organic compound-containing layer 705) so that the light absorption layer 704 generates heat, whereby at least part of the material contained in the organic compound-containing layer 705 is deposited as EL layers 752a, 752b, and 752c on the element substrate 759 (see FIG. 7C). Through the above steps, the EL layers 752a, 752b, and 752c can be selectively formed on the first electrode layers 751*a*, 751*b*, and 751*c*, respectively, which are formed on the substrate 759 (see FIG. 7D).

Figure 7D:
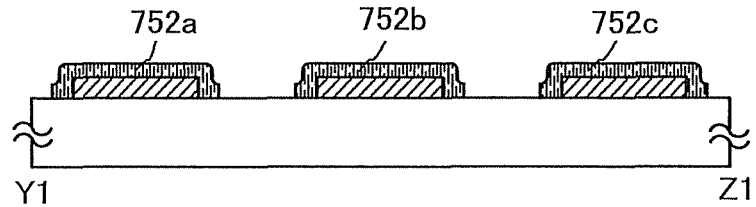

The second electrode layer 753*b* and the insulating layer 754 are formed over the EL layers 752*a*, 752*b*, and 752*c* illustrated in FIG. 7D, and sealed with a sealing substrate 758, whereby a light-emitting device illustrated in FIG. 5B can be completed.

The light-emitting device illustrated in FIGS. 5A and 5B shows an example in which the EL layers 752*a*, 752*b*, and 752*c* each have a width (the width in the direction Y1-Z1) larger than that of the first electrode layers 751*a*, 751*b*, and 751*c*, respectively, thereby covering the edges of the first electrode layers 751*a*, 751*b*, and 751*c*. This is because, in FIGS. 7A to 7D, the pattern of the organic compound-containing layers formed over the light absorption layer 704 in the first region has a width larger than that of the pattern of the first electrode layers.

Figure 6A:
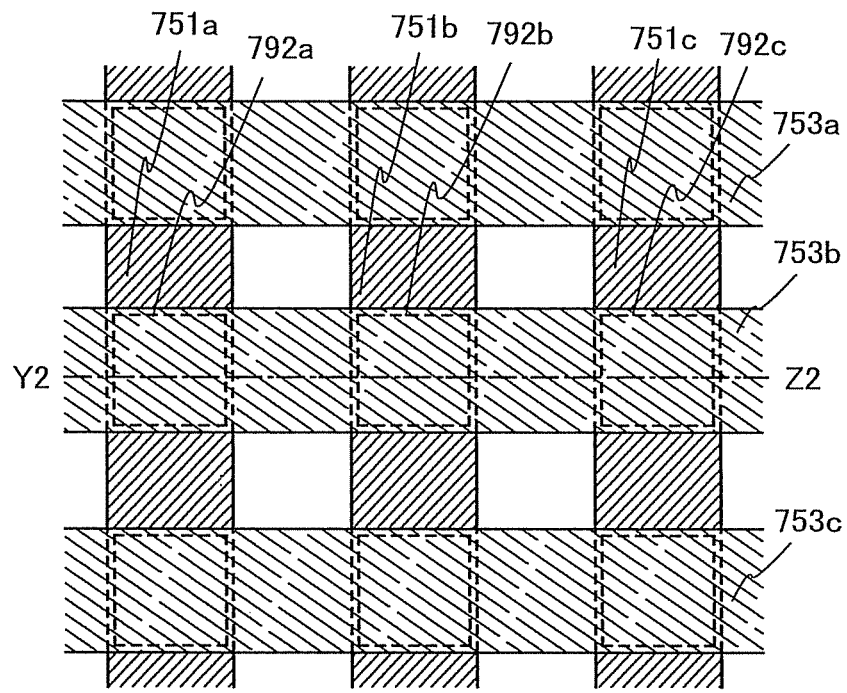
FIGS. 6A and 6B are respectively a plan view and a cross-sectional view illustrating a light-emitting device of the present invention.
Figure 6B:
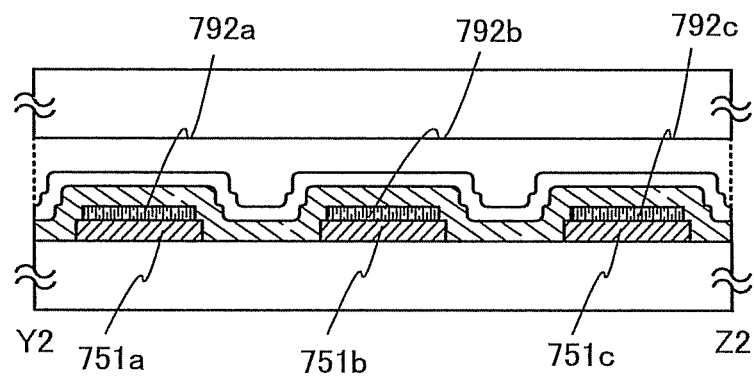

FIGS. 6A and 6B illustrate an example in which the EL layer is entirely formed on the first electrode layer. FIG. 6A is a plan view of a light-emitting device and FIG. 6B is a cross-sectional view taken along line Y2-Z2 of FIG. 6A. In the light-emitting device of FIGS. 6A and 6B, the size of EL layers 792*a*, 792*b*, and 792*c* is smaller than that of the first electrode layers 751*a*, 751*b*, and 751*c*; therefore, the EL layers 792*a*, 792*b*, and 792*c* are entirely formed on the first electrode layers 751*a*, 751*b*, and 751*c*, respectively. In the deposition method of the present invention, a film reflecting the pattern of the organic compound-containing layer formed over the light absorption layer that does not overlap the reflective layer, which is the pattern of the first region, is deposited on the deposition-target substrate. Thus, the EL layers 792*a*, 792*b*, and 792*c* can be deposited by making the pattern of the organic compound-containing layer formed over the light absorption layer in the first region smaller than that of the first electrode layers 751*a*, 751*b*, and 751*c*.

In the passive matrix light-emitting device, a partition wall (an insulating layer) for separating light-emitting elements may be provided. FIGS. 8A to 8C and FIGS. 9A to 9D illustrate an example of a light-emitting device having a two-layer partition wall.

Figure 8A:
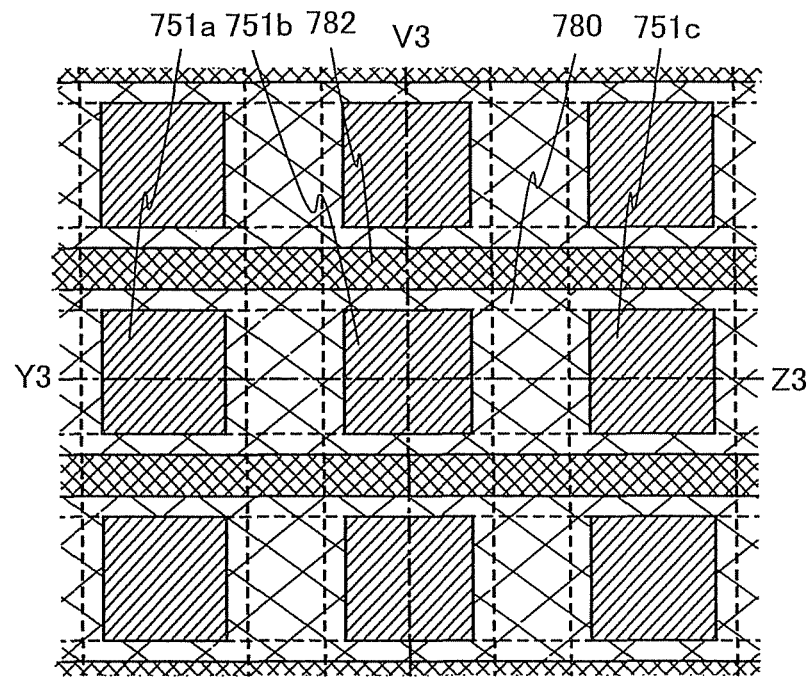
FIG. 8A is a plan view illustrating a light-emitting device of the present invention.
Figure 8B:
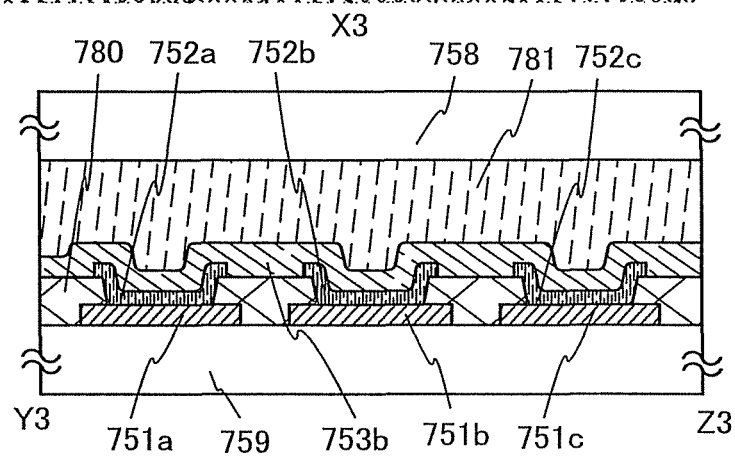
FIGS. 8B and 8C are cross-sectional views thereof.
Figure 8C:
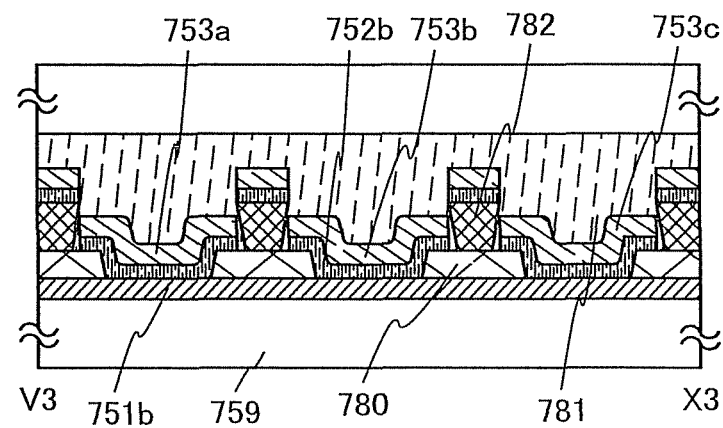

FIG. 8A is a plan view of a light-emitting device, FIG. 8B is a cross-sectional view taken along line Y3-Z3 of FIG. 8A, and FIG. 8C is a cross-sectional view taken along line V3-X3 of FIG. 8A. Note that FIG. 8A is a plan view illustrating the state in which a partition wall 782 has just been formed, and the EL layer and the second electrode layer are omitted in FIG. 8A.

As illustrated in FIGS. 8A to 8C, a pixel region includes an opening over each of the first electrode layers 751*a*, 751*b*, and 751*c*, and a partition wall 780 is selectively formed. As illustrated in FIG. 8B, the partition wall 780 has a tapered shape to cover the edges of the first electrode layers 751*a*, 751*b*, and 751*c*.

The partition wall 782 is selectively formed over the partition wall 780. The partition wall 782 has a function to discontinuously separate the EL layer and the second electrode layer formed over the partition wall 780. The sidewalls of the partition wall 782 have such a slope that the distance between opposite sidewalls is gradually narrowed toward the surface of the substrate. That is, a cross section in the direction of a short side of the partition wall 782 is a trapezoid, in which a lower base (a base that faces a surface of the partition wall 780 and touches the partition wall 780) is shorter than an upper base (a base that faces the surface of the partition wall 780 and does not touch the partition wall 780). Since the partition wall 782 has a so-called inversely tapered shape, the EL layer 752*b* is divided by the partition wall 782 in a self-aligned manner and can be selectively formed over the first electrode layer 751*b*. Thus, adjacent light-emitting elements are divided without being processed by etching, resulting in prevention of electrical failure such as a short circuit between the light-emitting elements.

A method for manufacturing the light-emitting device of this embodiment mode illustrated in FIG. 8B, using the deposition method of the present invention, will be described with reference to FIGS. 9A to 9D.

Figure 9A:
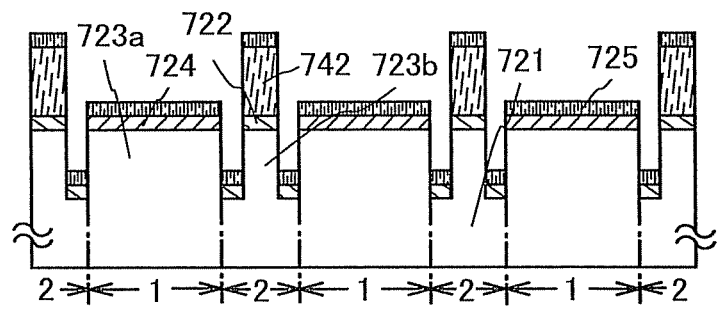
FIGS. 9A to 9D are cross-sectional views illustrating manufacturing steps of a light-emitting device of the present invention.

A deposition substrate illustrated in FIG. 9A has a structure similar to that of FIG. 19A shown in Embodiment Mode 1.

In the first region of the deposition substrate, a first heat-insulating layer 723*a* and a light absorption layer 724 are stacked as a projection of a substrate 721. In the second region, a reflective layer 722 is formed over a second heat-insulating layer 723*b* that is a projection of the substrate 721, and a third heat-insulating layer 742 is stacked over the reflective layer 722. An organic compound-containing layer 725 is formed as the uppermost layer of the deposition substrate.

Figure 9B:
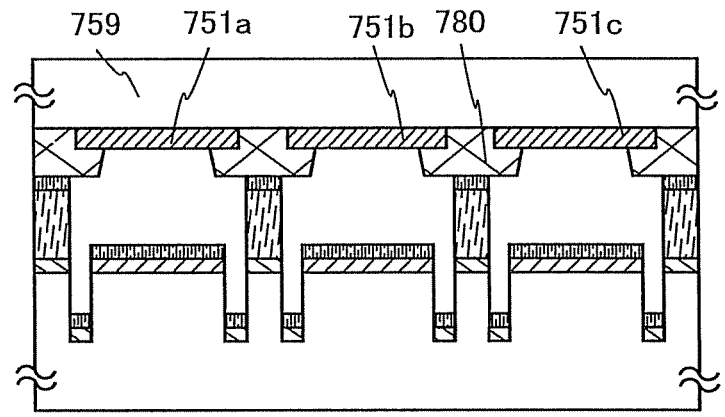

First electrode layers 751*a*, 751*b*, and 751*c* and a partition wall 780 are formed on the element substrate 759 that is a deposition-target substrate. The element substrate 759 and the substrate 721 are placed so that the organic compound-containing layer 725 faces the first electrode layers 751*a*, 751*b*, and 751*c* and the partition wall 780 (see FIG. 9B). When the partition wall 780 and the third heat-insulating layer 742 are formed and the deposition substrate and the deposition-target substrate are provided in contact with each other as illustrated in FIG. 9B, the pixel region in each first region can be separated from other pixel regions. Accordingly, a material evaporated from the organic compound-containing layer by light irradiation can be prevented from being attached to the other pixel regions.

Figure 9C:
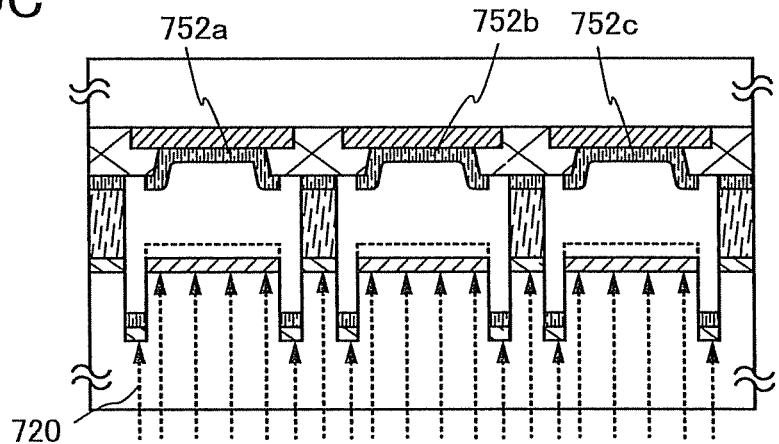

Light 720 is emitted from the back surface of the substrate 721 (the surface that does not include the organic compound-containing layer 725) so that the light absorption layer 724 generates heat, whereby at least part of the material contained in the organic compound-containing layer 725 is deposited as the EL layers 752*a*, 752*b*, and 752*c* on the element substrate 759 (see FIG. 9C). Through the above steps, the EL layers 752*a*, 752*b*, and 752*c* can be selectively formed on the first electrode layers 751*a*, 751*b*, and 751*c*, respectively, which are formed on the substrate 759 (see FIG. 9D).

Figure 9D:
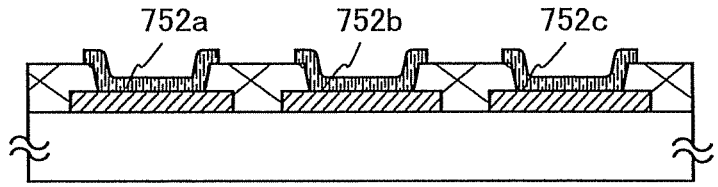

The second electrode layer 753*b* and a fill layer 781 are formed over the EL layers 752*a*, 752*b*, and 752*c* illustrated in FIG. 9D, and sealed with the sealing substrate 758, whereby the light-emitting device illustrated in FIG. 8B can be completed.

As the sealing substrate 758, a glass substrate, a quartz substrate, or the like can be used. Alternatively, a flexible substrate may be used. The flexible substrate is a substrate that can be bent. For example, besides a plastic substrate made of polycarbonate, polyarylate, polyether sulfone, or the like, a high-molecular material elastomer that exhibits characteristics of an elastic body like rubber at room temperature and can be plasticized to be processed like a plastic at high temperature can be used. Further alternatively, a film (a film made of polypropylene, polyester, vinyl, polyvinyl fluoride, vinyl chloride, or the like) or an inorganic evaporated film can be used.

For the partition walls 780 and 782, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant polymer such as polyimide, aromatic polyamide, or polybenzimidazole; or a siloxane resin may be used. Alternatively, it is also possible to use a resin material such as a vinyl resin such as polyvinyl alcohol or polyvinyl-butyral, an epoxy resin, a phenol resin, a novolac resin, an acrylic resin, a melamine resin, or a urethane resin. As a manufacturing method of the partition walls 780 and 782, a vapor deposition method such as plasma CVD or thermal CVD, or sputtering may be used. In addition, droplet discharging or printing can be employed. Furthermore, a film obtained by a coating method, or the like may be used as the partition walls 780 and 782.

Figure 13:
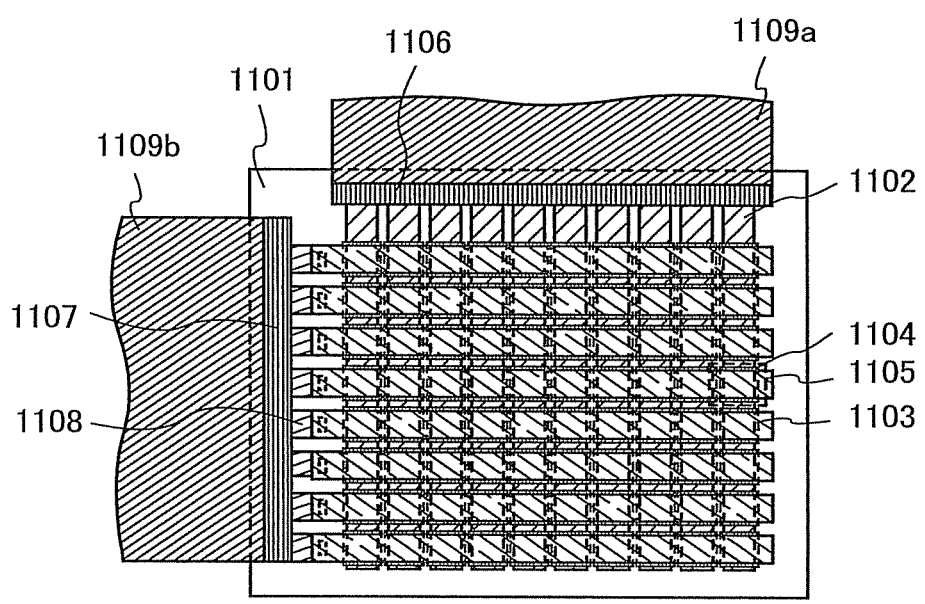
FIG. 13 is a top view illustrating a light-emitting display module of the present invention.

FIG. 13 is a top view of the passive matrix light-emitting device illustrated in FIGS. 5A and 5B, on which an FPC and the like are mounted.

In FIG. 13, scan lines and data lines perpendicularly intersect with each other in a pixel portion for displaying images.

The first electrode layers 751a, 751b, and 751c in FIGS. 5A and 5B correspond to data lines 1102 in FIG. 13, the second electrode layers 753a, 753b, and 753c in FIGS. 5A and 5B correspond to scan lines 1103 in FIG. 13, and the EL layers 752a, 752b, and 752c correspond to EL layers 1104 in FIG. 13. The EL layers 1104 are sandwiched between the data lines 1102 and the scan lines 1103, and an intersection indicated by a region 1105 corresponds to one pixel (indicated by the light-emitting element 750 in FIGS. 5A and 5B).

Note that ends of the scan lines 1103 are electrically connected to a connection wiring 1108, and the connection wiring 1108 is connected to an FPC 1109b through an input terminal 1107. The data lines 1102 are connected to an FPC 1109a through an input terminal 1106.

In addition, a polarizing plate, a circularly polarizing plate (including an elliptically polarizing plate), a retardation plate (a quarter-wave plate or a half-wave plate), or an optical film such as a color filter may be provided as appropriate over a light-emitting surface. Furthermore, the polarizing plate or the circularly polarizing plate may be provided with an anti-reflection film. For example, anti-glare treatment may be carried out by which reflected light can be diffused by surface roughness so as to reduce glare.

Although FIG. 13 illustrates an example in which a driver circuit is not provided over the substrate, the present invention is not particularly limited to this example. An IC chip including a driver circuit may be mounted on the substrate.

In the case where an IC chip is mounted, a data line side IC and a scan line side IC, each of which includes a driver circuit for transmitting each signal to the pixel portion, are mounted on the periphery of (outside of) the pixel portion by COG (chip on glass). The mounting may be performed by TCP or wire bonding other than COG. A TCP is a TAB (tape automated bonding) tape on which an IC is mounted, and the IC is mounted by connecting the TAB tape to a wiring over an element substrate. Each of the data line side IC and the scan line side IC may be formed using a single crystal silicon substrate. Alternatively, a driver circuit may be formed using TFTs over a glass substrate, a quartz substrate, or a plastic substrate. An example in which a single IC is provided on one side is described here; however, a plurality of ICs may be provided on one side.

By applying the present invention, a thin film can be formed in a fine pattern on a deposition-target substrate without providing a mask between a material and the deposition-target substrate. By forming the light-emitting element by such a deposition method as described in this embodiment mode, a high-definition light-emitting device can be manufactured.

This embodiment mode can be combined with any of Embodiment Modes 1 to 4 as appropriate.

Embodiment Mode 6

In this embodiment mode, an active matrix light-emitting device manufactured by the present invention will be described with reference to FIGS. 14A and 14B.

Figure 14A:
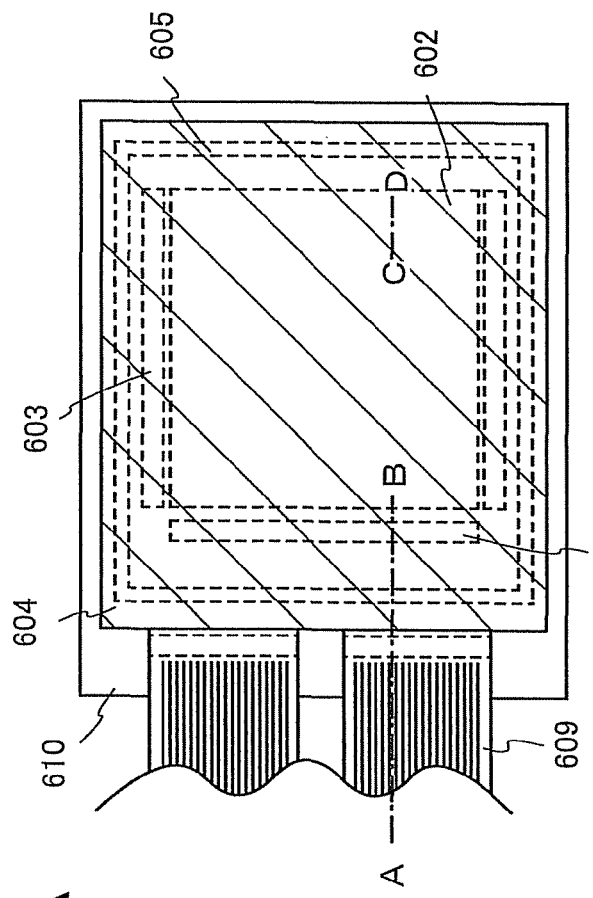
FIGS. 14A and 14B are respectively a top view and a cross-sectional view illustrating a light-emitting display module of the present invention.
Figure 14B:
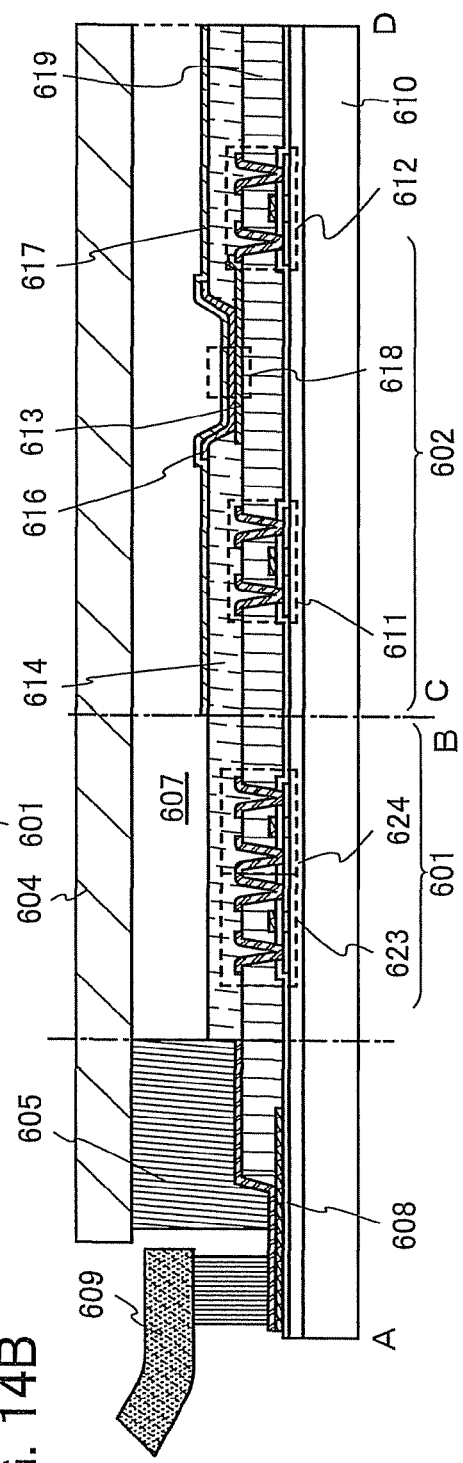

FIG. 14A is a top view of a light-emitting device and FIG. 14B is a cross-sectional view taken along lines A-B and C-D of FIG. 14A. Reference numeral 601 denoted by a dashed line indicates a driver circuit portion (a source driver circuit); 602, a pixel portion; and 603, a driver circuit portion (a gate driver circuit). Further, reference numeral 604 indicates a sealing substrate and reference numeral 605 indicates a sealing material. A space 607 is provided inside a portion surrounded by the sealing material 605.

A lead wiring 608 is a wiring for transmitting signals to be inputted to the source driver circuit 601 and the gate driver circuit 603, and receives video signals, clock signals, start signals, reset signals, and the like from an FPC (flexible printed circuit) 609 that serves as an external input terminal. Although only the FPC is illustrated here, this FPC may be provided with a printed wiring board (PWB). The light-emitting device in this specification refers not only to a light-emitting device itself but also to a light-emitting device to which an FPC or a PWB is attached.

Next, the cross-sectional structure of the light-emitting device is described with reference to FIG. 14B. The driver circuit portions and the pixel portion are provided over an element substrate 610; however, FIG. 14B illustrates only the source driver circuit 601 included in the driver circuit portions and one pixel in the pixel portion 602.

Note that as the source driver circuit 601, a CMOS circuit combining an N-channel transistor 623 and a P-channel transistor 624 is formed. Alternatively, the driver circuit may include various CMOS circuits, PMOS circuits, or NMOS circuits. Although this embodiment mode shows a driver-integrated type in which the driver circuits are formed over the substrate, the driver circuits are not necessarily formed over the substrate, but may be formed outside the substrate.

The pixel portion 602 has a plurality of pixels each provided with a switching transistor 611, a current-controlling transistor 612, and a first electrode 613 electrically connected to a drain of the current-controlling transistor 612. Note that an insulating layer 614 is formed to cover the edge of the first electrode 613. Here, the insulating layer 614 is formed of a positive photosensitive acrylic resin film. The first electrode 613 is formed over an insulating layer 619 that is an interlayer insulating layer.

In order to improve the coverage, the insulating layer 614 is formed so as to have a curved surface with a curvature at either an upper end portion or a lower end portion. For example, in the case of using a positive photosensitive acrylic film for the insulating layer 614, it is preferable that the insulating layer 614 have a curved surface with a curvature radius (0.2 μm to 3 μm) only at the upper end portion. Alternatively, the insulating layer 614 may be formed of either negative photosensitive acrylic that becomes insoluble in an etchant after light irradiation, or positive photosensitive acrylic that becomes dissoluble in an etchant after light irradiation.

There is no particular limitation on the structure of the transistor. The transistor may have a single-gate structure including one channel formation region, a double-gate structure including two channel formation regions, or a triple-gate structure including three channel formation regions. Furthermore, a transistor on the periphery of the driver circuit region may also have a single-gate structure, a double-gate structure, or a triple-gate structure.

The transistor may have a top-gate structure (e.g., a staggered structure or a coplanar structure), a bottom-gate structure (e.g., an inverted-coplanar structure), a dual-gate structure including two gate electrode layers provided over and under a channel region each with a gate insulating film interposed therebetween, or other structures.

In addition, there is no particular limitation on the crystallinity of a semiconductor used for the transistor. The semiconductor layer can be formed of the following materials: an amorphous semiconductor formed by sputtering or a vapor-phase growth method using a semiconductor material gas typified by silane or germane; a polycrystalline semiconductor formed by crystallizing the amorphous semiconductor by utilizing light energy or thermal energy; a single crystal semiconductor; and the like.

The amorphous semiconductor is typified by hydrogenated amorphous silicon, and the crystalline semiconductor is typified by polysilicon or the like. Polysilicon (polycrystalline silicon) includes so-called high-temperature polysilicon that contains as its main component polysilicon formed at a process temperature of 800° C. or higher, so-called low-temperature polysilicon that contains as its main component polysilicon formed at a process temperature of 600° C. or lower, and polysilicon formed by crystallizing amorphous silicon by using, for example, an element that promotes crystallization. Instead of such a thin film process, an SOI substrate in which a single crystal semiconductor layer is provided on an insulating surface may be used. The SOI substrate can be formed by a separation by implanted oxygen (SIMOX) method or a Smart-Cut (registered trademark) method. In the SIMOX method, after oxygen ions are implanted into a single crystal silicon substrate to form an oxygen-containing layer at a predetermined depth, heat treatment is performed, an embedded insulating layer is faulted at a predetermined depth from the surface of the single crystal silicon substrate, and a single crystal silicon layer is formed over the embedded insulating layer. In the Smart-Cut (registered trademark) method, hydrogen ions are implanted into an oxidized single crystal silicon substrate to form a hydrogen-containing layer at a predetermined depth, the oxidized single crystal silicon substrate is attached to another supporting substrate (e.g., a single crystal silicon substrate having a surface provided with a silicon oxide film for bonding), and heat treatment is performed, whereby the single crystal silicon substrate is separated at the hydrogen-containing layer to form a stack of the silicon oxide film and the single crystal silicon layer on the supporting substrate.

An EL layer 616 and a second electrode 617 are formed over the first electrode 613. The EL layer 616 of the light-emitting element shown in this embodiment mode can be formed by the deposition method shown in Embodiment Mode 1.

The sealing substrate 604 and the element substrate 610 are attached to each other with the sealing material 605, whereby a light-emitting element 618 is provided in the space 607 surrounded by the element substrate 610, the sealing substrate 604, and the sealing material 605. Note that the space 607 is filled with an inert gas (nitrogen, argon, or the like) or a filler such as the sealing material 605.

As the sealing material 605, a visible-light curing resin, an ultraviolet curing resin, or a thermosetting resin is preferably used. Specifically, an epoxy resin can be used. In addition, it is preferable to use a material that prevents penetration of moisture or oxygen as much as possible. As the sealing substrate 604, a plastic substrate made of FRP (Fiberglass-Reinforced Plastics), PVF (polyvinyl fluoride), polyester, acrylic, or the like can be used as well as a glass substrate or a quartz substrate. Alternatively, a film (made of polypropylene, polyester, vinyl, polyvinyl fluoride, vinyl chloride, or the like), or an inorganic evaporated film may be used.

An insulating layer may be provided as a passivation film (a protective film) over the light-emitting element. As the passivation film, it is possible to use a single layer or stacked layers of an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon. Alternatively, a siloxane resin may be used.

Instead of the filler, nitrogen or the like may be encapsulated by sealing in a nitrogen atmosphere. In the case where light is extracted from the light-emitting device through the filler, the filler needs to transmit light. As the filler, a visible-light curing epoxy resin, an ultraviolet curing epoxy resin, or a thermosetting epoxy resin may be used. The filler may be dripped in a liquid state to fill the space in the light-emitting device. When a hygroscopic substance such as a desiccant is used as the filler, or a hygroscopic substance is added to the filler, higher absorbing effect can be achieved and deterioration of elements can be prevented.

In addition, a retardation plate or a polarizing plate may be used to block the reflection of external incident light. An insulating layer serving as a partition wall may be colored to be used as a black matrix. This partition wall can be formed by droplet discharging with the use of carbon black or the like mixed into a resin material such as polyimide, and a stack thereof may also be used. By droplet discharging, different materials may be discharged to the same region plural times to form a partition wall. As the retardation plate, a quarter-wave plate and a half-wave plate may be used to control light. As the structure, the element substrate, the light-emitting element, the sealing substrate (the sealing material), the retardation plates (a quarter-wave plate and a half-wave plate), and the polarizing plate are provided in this order, and light emitted from the light-emitting element passes therethrough and is emitted to the outside from the polarizing plate side. The retardation plates and the polarizing plate may be provided on a side from which light is emitted, and may be provided on both sides in the case of a dual-emission light-emitting device in which light is emitted from the both sides. In addition, an anti-reflection film may be provided outside the polarizing plate. Accordingly, higher-resolution and more precise images can be displayed.

Although the aforementioned circuit is used in this embodiment mode, the present invention is not limited thereto and an IC chip may be mounted as a peripheral driver circuit by the aforementioned COG or TAB. Furthermore, the number of gate driver circuits and source driver circuits is not especially limited.

In the light-emitting device of the present invention, a driving method for displaying images is not particularly limited, and for example, a dot-sequential driving method, a line-sequential driving method, an area-sequential driving method, or the like may be used. Typically, the line-sequential driving method is used, and a time-division gray scale driving method or an area gray scale driving method may be used as appropriate. Furthermore, an image signal inputted to the source line of the light-emitting device may be either an analog signal or a digital signal. The driver circuit and the like may be designed as appropriate depending on the image signal.

The light-emitting layer may have a structure in which light-emitting layers having different wavelength ranges are formed in respective pixels so that color display is performed.

Typically, light-emitting layers corresponding to R (red), G (green), and B (blue) are formed. Also in that case, a filter transmitting light of a wavelength range may be provided on the side of a pixel from which light is emitted, whereby color purity can be improved and a pixel region can be prevented from having a mirror surface (reflecting). By providing the filter, the loss of light emitted from the light-emitting layer can be eliminated. Furthermore, it is possible to reduce a change in color tone, which occurs when the pixel region (a display screen) is seen from an oblique angle.

By applying the present invention, a thin film can be formed in a fine pattern on a deposition-target substrate without providing a mask between a material and the deposition-target substrate. By forming the light-emitting element by such a deposition method as described in this embodiment mode, a high-definition light-emitting device can be manufactured.

This embodiment mode can be combined with any of Embodiment Modes 1 to 4 as appropriate.

Embodiment Mode 7

By applying the present invention, light-emitting devices having a variety of display functions can be manufactured. That is, the present invention can be applied to various electronic devices in which the light-emitting device having a display function is incorporated in a display portion.

Examples of such electronic devices using the present invention are as follows: a television device (also simply referred to as a television or a television receiver), a camera such as a digital camera or a digital video camera, a cellular telephone device (also simply referred to as a cellular phone or a cell-phone), a portable information terminal such as a PDA, a portable game machine, a computer monitor, a computer, a sound reproducing device such as a car audio system, an image reproducing device including a recording medium, such as a home-use game machine, and the like. Furthermore, the present invention can be applied to any game machine having a light-emitting device, such as a pachinko machine, a slot machine, a pinball machine, a large-scale game machine, and the like. Specific examples will be described with reference to FIGS. 15A to 15F, FIGS. 16A and 16B, and FIGS. 17A to 17C.

The application range of the light-emitting device of the present invention is so wide that the light-emitting device can be applied to electronic devices of various fields. By using the deposition method of the present invention shown in Embodiment Mode 1, productivity can be improved and a high-definition pattern can be formed; thus, electronic devices with high-image quality, which has a large display portion or lighting portion, can be provided at low cost.

Figure 15A:
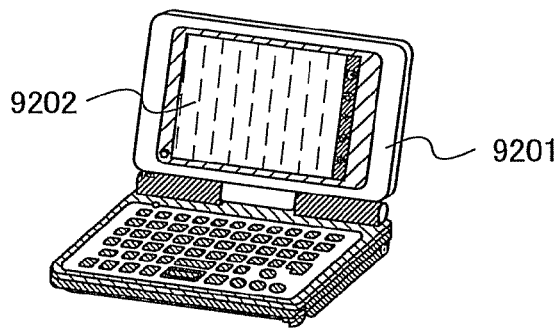
FIGS. 15A to 15F are diagrams each illustrating an electronic device of the present invention.

A portable information terminal device illustrated in FIG. 15A includes a main body 9201, a display portion 9202, and the like. The light-emitting device of the present invention can be applied to the display portion 9202. As a result, a portable information terminal device with high-image quality can be provided at low cost.

Figure 15B:
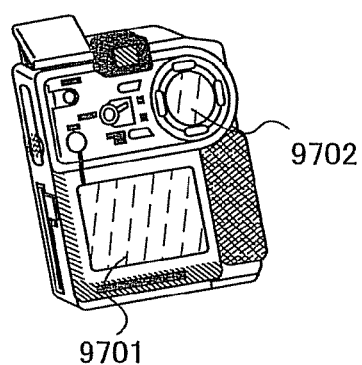

A digital video camera illustrated in FIG. 15B includes a display portion 9701, a display portion 9702, and the like. The light-emitting device of the present invention can be applied to the display portion 9701. As a result, a digital video camera with high-image quality can be provided at low cost.

Figure 15C:
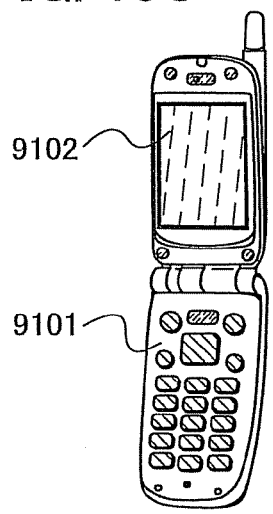

A cellular phone illustrated in FIG. 15C includes a main body 9101, a display portion 9102, and the like. The light-emitting device of the present invention can be applied to the display portion 9102. As a result, a cellular phone with high-image quality can be provided at low cost.

Figure 17A:
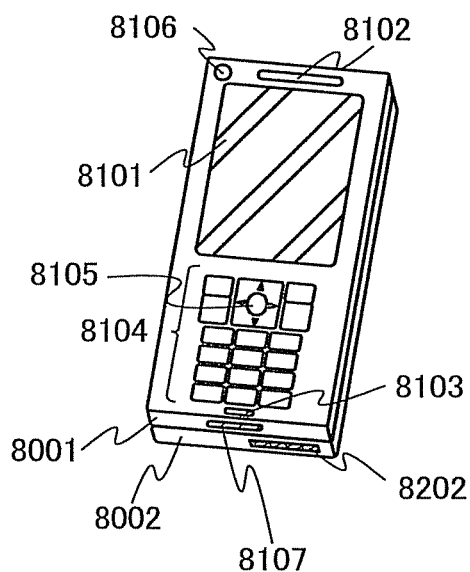
FIGS. 17A to 17C are diagrams illustrating an electronic device of the present invention.
Figure 17B:
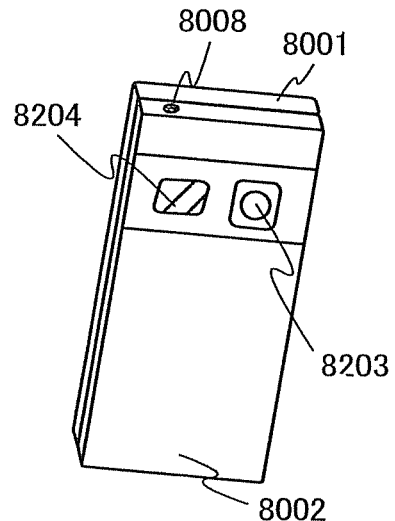
Figure 17C:
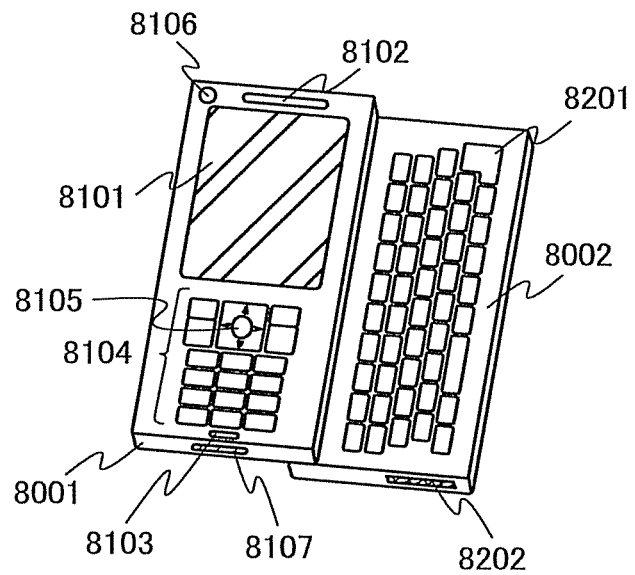

FIGS. 17A to 17C illustrate an example of a cellular phone using the present invention, which has a structure different from that of FIG. 15C. FIG. 17A is a front view, FIG. 17B is a back view, and FIG. 17C is a development view. The cellular phone illustrated in FIGS. 17A to 17C is a so-called smart-phone that has both functions of a cellular phone and a portable information terminal, incorporates a computer, and conducts a variety of data processing in addition to voice calls.

The cellular phone illustrated in FIGS. 17A to 17C has two housings 8001 and 8002. The housing 8001 includes a display portion 8101, a speaker 8102, a microphone 8103, operation keys 8104, a pointing device 8105, a camera lens 8106, an external connection terminal 8107, an earphone terminal 8108, and the like, while the housing 8002 includes a keyboard 8201, an external memory slot 8202, a camera lens 8203, a light 8204, and the like. In addition, an antenna is incorporated in the housing 8001.

In addition to the above structure, the cellular phone may incorporate a non-contact IC chip, a small-size memory device, or the like.

The light-emitting device shown in the aforementioned embodiment modes can be incorporated in the display portion 8101, and the display orientation can be changed as appropriate depending on usage. Since the cellular phone is provided with the camera lens 8106 on the same surface as the display portion 8101, it can be used as a videophone. Furthermore, still images and moving images can be taken with the camera lens 8203 and the light 8204 by using the display portion 8101 as a viewfinder. The speaker 8102 and the microphone 8103 can be used not only for verbal communication, but also for videophone, recording, playback, and the like. The operation keys 8104 allow incoming and outgoing calls, input of simple information such as e-mails, scrolling of a screen, cursor motion, and the like. Furthermore, the housing 8001 and the housing 8002 that overlap each other (FIG. 17A) slide relative to each other to be developed as illustrated in FIG. 17C, and can be used as a portable information terminal. In that case, operation can be smoothly performed using the keyboard 8201 and the pointing device 8105. The external connection terminal 8107 can be connected to an AC adapter and a variety of cables such as a USB cable, and can be used for the charge of a built-in battery and for data communication with a computer or the like. Furthermore, a larger amount of data can be stored and transferred using a storage medium inserted into the external memory slot 8202.

In addition to the aforementioned functions, the cellular phone may also have an infrared communication function, a television reception function, or the like.

The light-emitting device of the present invention can be applied to the display portion 8101. As a result, a cellular phone with high-image quality can be provided at low cost.

Figure 15D:
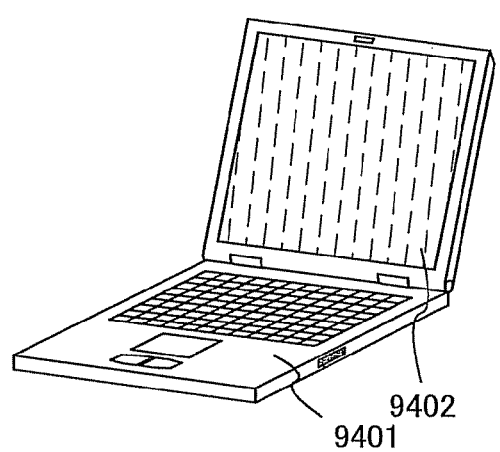
Figure 15E:
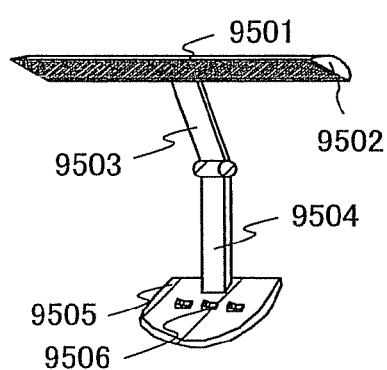

A portable computer illustrated in FIG. 15D includes a main body 9401, a display portion 9402, and the like. The light-emitting device of the present invention can be applied to the display portion 9402. As a result, a portable computer with high-image quality can be provided at low cost.

The light-emitting device of the present invention can also be applied to a small-size desk lamp or a large-size indoor lighting device. A desk lamp illustrated in FIG. 15E includes a lighting portion 9501, a shade 9502, an adjustable arm 9503, a support 9504, a base 9505, and a power source 9506. The light-emitting device of the present invention can be applied to the lighting portion 9501. Note that the lighting device includes a ceiling light, a wall light, and the like. By applying the present invention, a large-size lighting device can be provided at low cost.

Furthermore, the light-emitting device of the present invention can be used as a backlight of a liquid crystal display device. Since the light-emitting device of the present invention is a lighting device with planar light emission and can be increased in area, the area of the backlight can be increased, resulting in the liquid crystal display device with a larger area. In addition, the light-emitting device of the present invention has a small thickness; thus, the thickness of the liquid crystal display device can also be reduced.

Figure 15F:
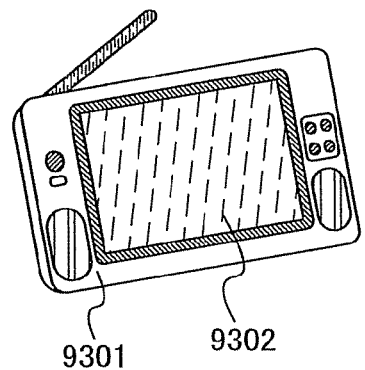

A portable television device illustrated in FIG. 15F includes a main body 9301, a display portion 9302, and the like. The light-emitting device of the present invention can be applied to the display portion 9302. As a result, a portable television device with high-image quality can be provided at low cost. Furthermore, the light-emitting device of the present invention can be applied to a wide range of television devices: small devices installed in portable terminals such as cellular phones; mid-sized devices that can be picked up and carried; and large-sized devices (for example, 40-inch displays and above).

Figure 16A:
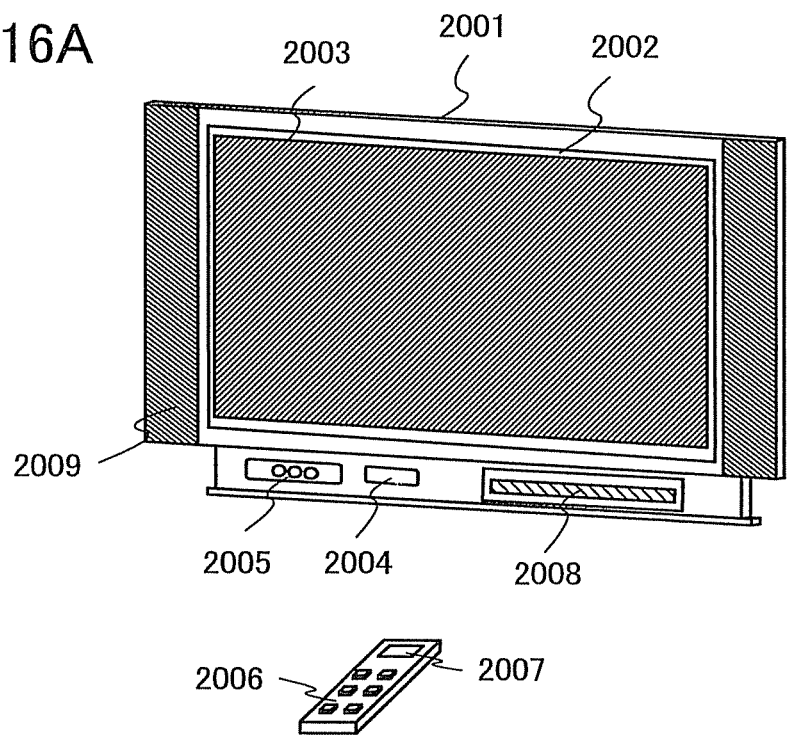
FIGS. 16A and 16B are diagrams each illustrating an electronic device of the present invention.

FIG. 16A illustrates a television device having a large-size display portion. The light-emitting device of the present invention can be applied to a main screen 2003. The television device also includes a speaker portion 2009, operation switches, and the like. In such a manner, a television device can be completed.

As illustrated in FIG. 16A, a display panel 2002 using a light-emitting element is incorporated in a housing 2001. The television device can receive general TV broadcast with a receiver 2005. When the television device is connected to a communication network by wired or wireless connections via a modem 2004, one-way (from a sender to a receiver) or two-way (between a sender and a receiver or between receivers) information communication can also be performed. The television device can be operated by a switch built in the housing, or a remote control unit 2006 that is provided separately. The remote control unit 2006 may also have a display portion 2007 for displaying information to be outputted.

The television device may also include a sub screen 2008 formed using a second display panel in addition to the main screen 2003, so that channels, sound volume, and the like are displayed.

Figure 16B:
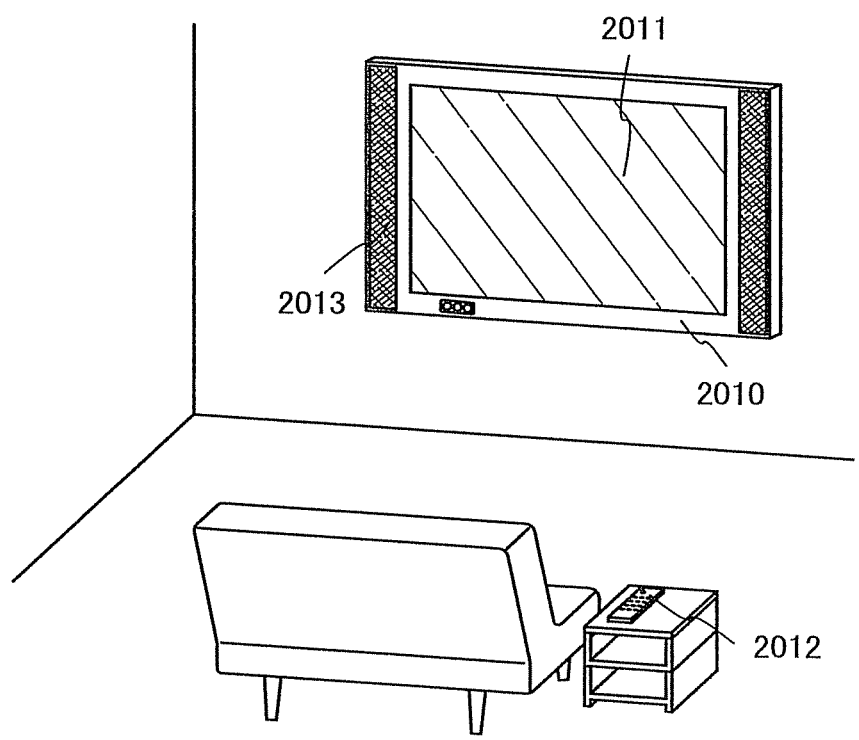

FIG. 16B illustrates a television device having a large-size display portion, for example, a 20-inch to 80-inch display portion. The television device includes a housing 2010, a display portion 2011, a remote control unit 2012 that is an operation portion, a speaker portion 2013, and the like. The present invention is applied to the display portion 2011. By applying the present invention, a large-size television device with high-image quality can be provided at low cost. The television device illustrated in FIG. 16B is a wall-hanging type, and does not require a large installation space.

Needles to say, the present invention can be applied to various applications, particularly to large-size display media such as an information board at train stations, airports, or the like, or an advertising display screen on the street.

This embodiment mode can be combined with any of Embodiment Modes 1 to 6 as appropriate.

Embodiment 1

Figure 21:
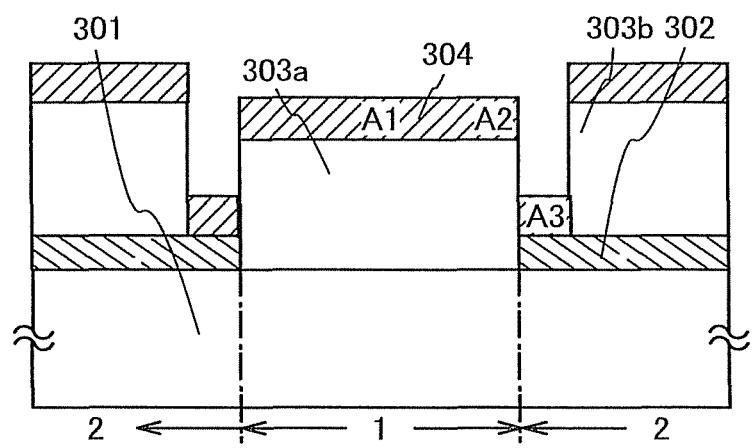
FIG. 21 is a cross-sectional view illustrating a deposition substrate of Embodiment 1.
Figure 22A:
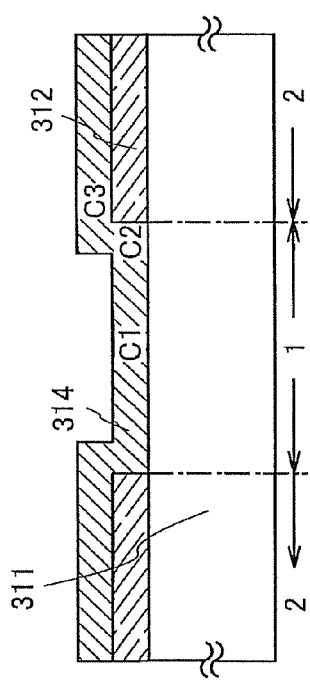
FIGS. 22A and 22B are cross-sectional views of a deposition substrate of comparative example 1 and comparative example 2, respectively.
Figure 22B:
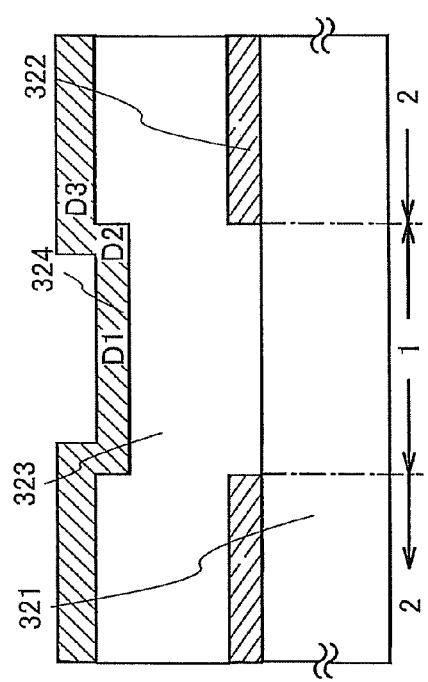

In this embodiment, the heat distribution on a deposition substrate used in the deposition method of the present invention, at the time of light irradiation, is calculated. Models used for the calculation are illustrated in FIG. 21 and FIGS. 22A and 22B. Note that the calculation is performed using a two-dimensional model. In the present invention, a deposition substrate and a deposition-target substrate are preferably placed close to each other in order to selectively form a thin film in a more precise pattern. Furthermore, it is preferable to reduce the thickness of a heat-insulating layer so that a deposition substrate is easily manufactured. In this embodiment, calculation is performed using the following models in order to confirm that the effect of the present invention can be obtained even if the thickness of a heat-insulating layer is not large enough to completely block heat conduction.

The model illustrated in FIG. 21 is a deposition substrate of this embodiment. A two-dimensional model is employed in which a reflective layer 302 (a 200 nm thick aluminum film), a first heat-insulating layer 303a (a 1000 nm thick silicon oxide film), a second heat-insulating layer 303b (a 1000 nm thick silicon oxide film), and a light absorption layer 304 (a 200 nm thick titanium film) are formed over a glass substrate 301 (0.7 mm thick). Note that the width of the first region corresponding to an opening of the reflective layer 302 is 23.5 μm. The temperature of the center of a film is measured at each of positions A1, A2, and A3. In FIG. 21, A1 is the center of the first region, a position 9.2 μm away from A1 in a film-plane direction is A2, and a position 22.2 μm away from A1 in a film-plane direction is A3.

The models illustrated in FIGS. 22A and 22B are deposition substrates used for comparison. FIG. 22A is a deposition substrate of comparative example 1, and FIG. 22B is a deposition substrate of comparative example 2. As illustrated in FIG. 22A, a two-dimensional model is employed in which a reflective layer 312 (a 200 nm thick aluminum film) and a light absorption layer 314 (a 200 nm thick titanium film) are formed over a glass substrate 311 (0.7 mm thick). Note that the width of the first region corresponding to an opening of the reflective layer 312 is 23.5 μm. The temperature of the center of a film is measured at each of positions C1, C2, and C3. In FIG. 22A, C1 is the center of the first region, a position 9.2 μm away from C1 in a film-plane direction is C2, and a position 22.2 μm away from C1 in a film-plane direction is C3.

FIG. 22B has a structure in which a continuous heat-insulating layer 323 is provided between the reflective layer 312 and the light absorption layer 314 of FIG. 22A. A two-dimensional model is employed in which a reflective layer 322 (a 200 nm thick aluminum film), the heat-insulating layer 323 (1000 nm thick silicon oxide film), a light absorption layer 324 (a 200 nm thick titanium film) are formed over a glass substrate 321 (0.7 mm thick). Note that the width of the first region corresponding to an opening of the reflective layer 322 is 23.5 μm. The temperature of the center of, a film is measured at each of positions D1, D2, and D3. In FIG. 22B, D1 is the center of the first region, a position 9.2 μm away from D1 in a film-plane direction is D2, and a position 22.2 μm away from D1 in a film-plane direction is D3.

Calculation conditions are as follows: calculation tool is ANSYS; a free mesh of three-node triangle is used; and the minimum mesh length is 0.05 μm. Since the heat conduction characteristics depend on temperature, a nonlinear analysis (Newton method) is employed. The time interval of the non-stationary analysis is 0.125 μs, the initial temperature is uniformly 27° C., and the boundary conditions are all heat-insulating boundary conditions.

Figure 23:
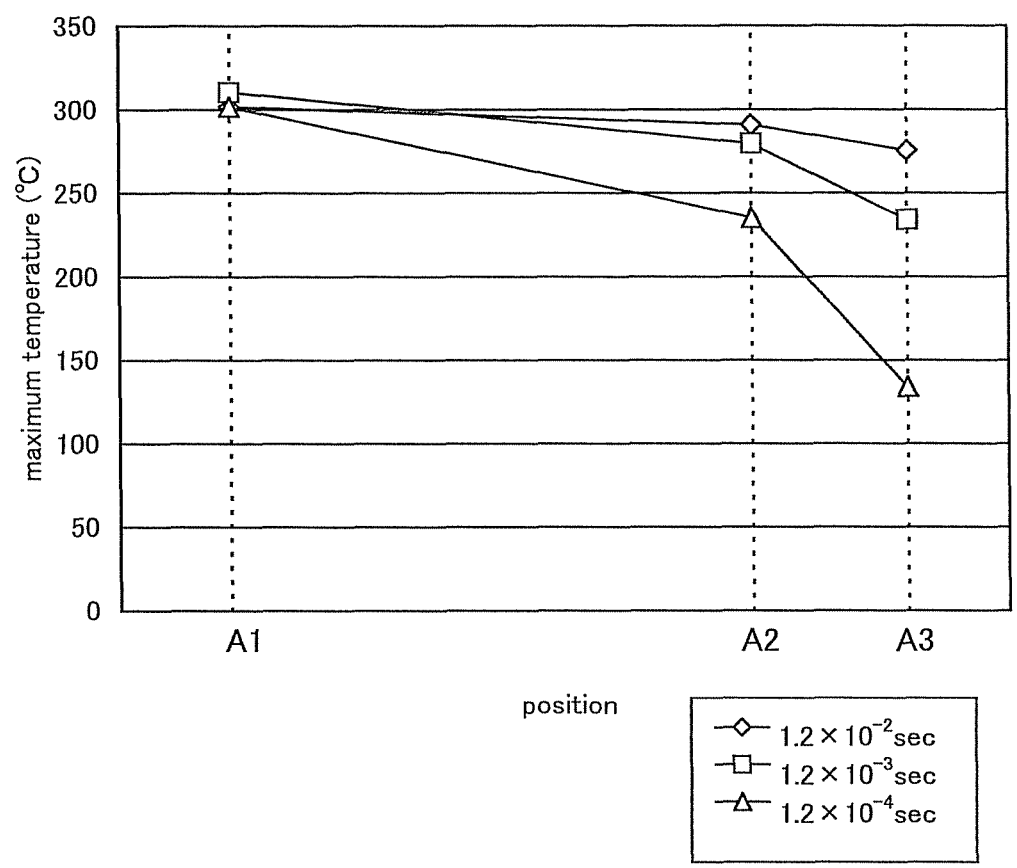
FIG. 23 is a graph showing the maximum temperature of the deposition substrate of Embodiment 1 at the time of light irradiation.
Figure 24:
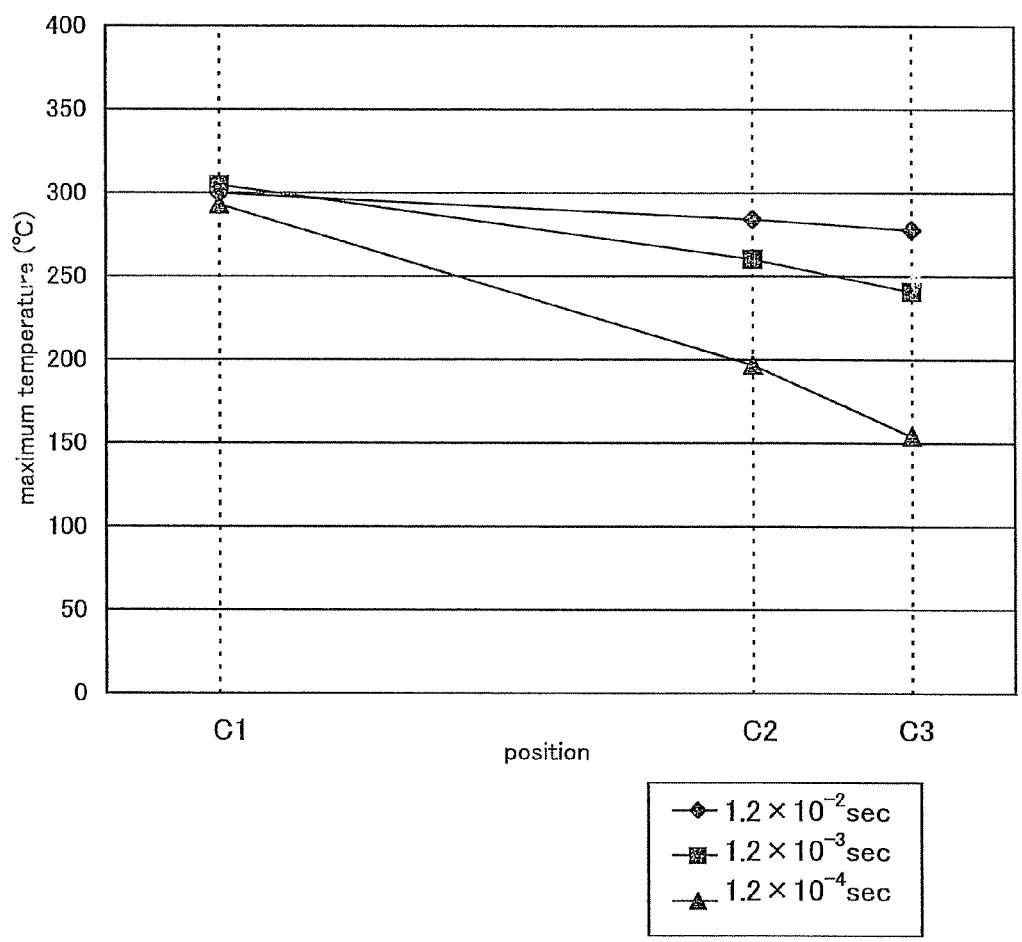
FIG. 24 is a graph showing the maximum temperature of the deposition substrate of the comparative example 1 at the time of light irradiation.
Figure 25:
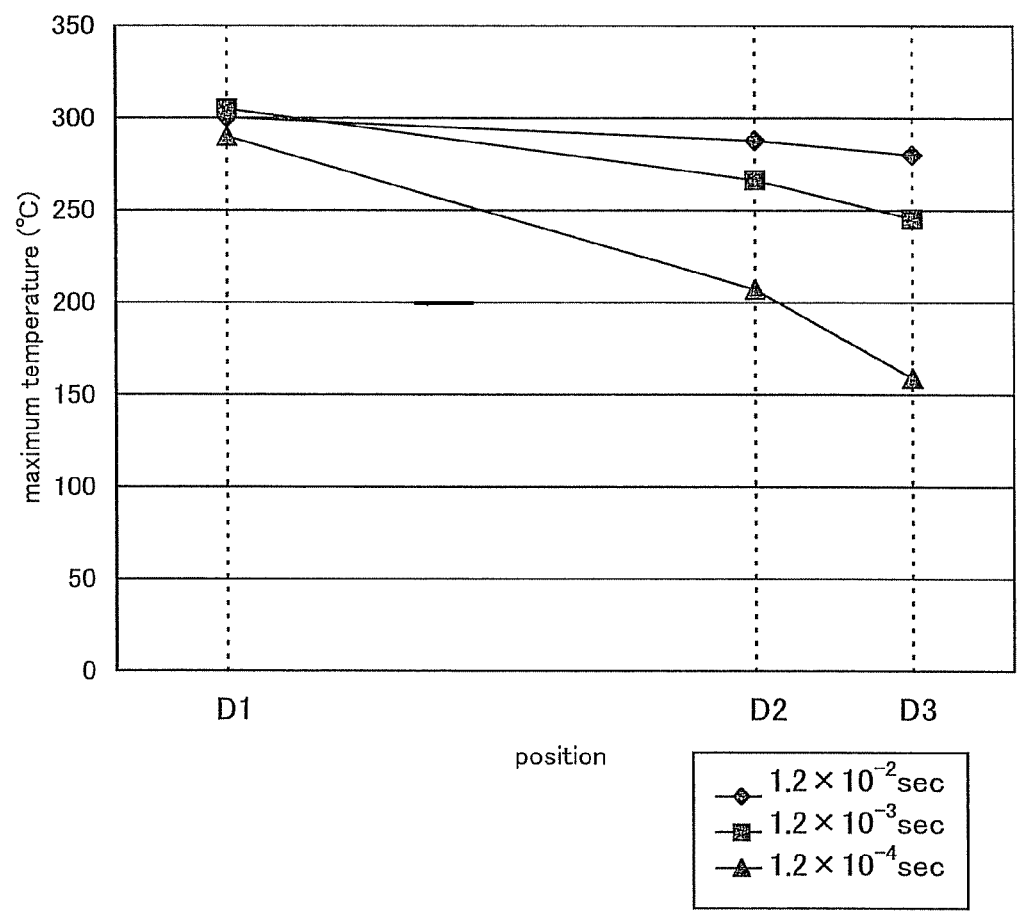
FIG. 25 is a graph showing the maximum temperature of the deposition substrate of the comparative example 2 at the time of light irradiation.

Calculation results are shown in FIGS. 23 to 25. FIGS. 23 to 25 are graphs showing the relationship of the maximum temperature at each measurement position. Each model is irradiated with light for $1.2 \times 10^{-2}$ sec., $1.2 \times 10^{-3}$ sec., and $1.2 \times 10^{-4}$ sec. In FIG. 23, the measurement values at an irradiation time of $1.2 \times 10^{-2}$ sec. are indicated by white diamond-shaped dots, the measurement values at an irradiation time of $1.2\times10^{-3}$ sec. are indicated by white square dots, and the measurement values at an irradiation time of $1.2\times10^{-4}$ sec. are indicated by white triangular dots. In FIGS. 24 and 25, the measurement values at an irradiation time of $1.2\times10^{-2}$ sec. are indicated by black diamond-shaped dots, the measurement values at an irradiation time of $1.2\times10^{-3}$ sec. are indicated by black square dots, and the measurement values at an irradiation time of $1.2\times10^{-4}$ sec. are indicated by black triangular dots.

Table 1 shows the temperature difference between the first region in which a material in the first organic compound-containing layer is deposited on the deposition-target substrate and the second region in which light is reflected by the reflective layer and a material in the second organic compound-containing layer is not deposited on the deposition-target substrate. The temperature difference is measured between A2, C2, and D2 that are the end of the light absorption layer in the first region, and A3, C3, and D3 that are the end of the light absorption layer over the reflective layer in the second region.

TABLE 1

| irradiation time (sec) | embodiment temperature difference between A2 and A3 (° C.) | comparative example 1 temperature difference between C2 and C3 (° C.) | comparative example 2 temperature difference between D2 and D3 (° C.) |
|---|---|---|---|
| $1.2 \times 10^{-2}$ | 15 | 6 | 8 |
| $1.2 \times 10^{-3}$ | 46 | 19 | 21 |
| $1.2 \times 10^{-4}$ | 101 | 43 | 48 |

As shown in FIGS. 23 to 25, the maximum temperature is measured at A1, C1, and D1 in each model, which is the center of the first region in which light is absorbed by the light absorption layer. The maximum temperature decreases toward the second region in which light is reflected by the reflective layer (from A2, C2, and D2 to A3, C3, and D3). In each model, the temperature difference between A2 and A3, between C2 and C3, and between D2 and D3, each of which is on the boundary between the first region and the second region, decreases as the irradiation time increases. This is because, as the irradiation time increases, heat is conducted from the first region to the second region and the temperature of the second region increases. Thus, in the case where a light source with high energy is used or light is emitted for a long time, in order to further decrease the temperature of the second region, it is preferable to increase the thickness of the first heat-insulating layer and the second heat-insulating layer and increase the heat conduction path from the light absorption layer over the first heat-insulating layer to the organic compound-containing layer over the second heat-insulating layer. The heat is absorbed or diffused to be dissipated while passing through the first heat-insulating layer, the light-transmitting substrate, and the second heat-insulating layer that are the heat conduction path. It is preferable that the heat conduction path include elements made of different materials, such as the first heat-insulating layer, the light-transmitting substrate, and the second heat-insulating layer, because more heat can be dissipated when passing therethrough. By increasing the heat conduction path from the light absorption layer over the first heat-insulating layer to the organic compound-containing layer over the sec and heat-insulating layer, the time for the heat to reach the second region increases and more heat is dissipated. Therefore, the temperature of the organic compound-containing layer in the second region can be lowered.

As shown in Table 1, the temperature difference between the first region and the second region of this embodiment (A2 and A3) is more than twice that between the first region and the second region of the comparative examples 1 and 2 (C2 and C3, and D2 and D3).

When there is a space (a distance) between the first heat-insulating layer in the first region and the second heat-insulating layer in the second region as in this embodiment, the heat conduction path from the light absorption layer in the first region to the organic compound-containing layer in the second region can be increased. Accordingly, the time for the heat generated in the light absorption layer in the first region to reach the second region increases. Furthermore, the heat is absorbed or diffused to be dissipated while passing through the first heat-insulating layer, the light-transmitting substrate, and the second heat-insulating layer. Thus, in this embodiment, it is confirmed that the temperature of the second region could be lowered and the temperature difference between the first region and the second region could be increased.

Accordingly, a large part of the organic compound-containing layer in the second region can be left in the deposition substrate; therefore, the film reflecting the pattern of the first region can be selectively deposited in a fine pattern on the deposition-target substrate. In addition, even when lamp light, which requires a longer irradiation time than laser light, is used, the organic compound-containing layer in the second region can be prevented from being heated and the temperature difference between the first region and the second region can be kept; thus, a lamp can be used as a light source. A larger, area can be treated at a time with lamp light as compared with laser light, resulting in reduction in manufacturing time and improvement in throughput.

Thus, as compared with in the models of the comparative examples, in the model of this embodiment, the material in the organic compound-containing layer in the second region can be prevented from being attached to the deposition-target substrate, and a deposition pattern can be prevented from being deformed due to heat conducted from the first region. Accordingly, by applying the deposition substrate used for the deposition method of the present invention, a higher-definition light-emitting device can be manufactured at low cost.

This application is based on Japanese Patent Application serial No. 2008-104906 filed with Japan Patent Office on Apr. 14, 2008, the entire contents of which are hereby incorporated by reference.

What is claimed is:

1. A deposition substrate comprising:
   a first region including:
      a first heat-insulating layer provided over a substrate capable of transmitting light, the first heat-insulating layer being capable of transmitting the light;
      a light absorption layer provided over the first heat-insulating layer, the light absorption layer being capable of absorbing the light; and
      a first organic compound-containing layer provided over the light absorption layer; and a second region including:
- a reflective layer provided over the substrate, the reflective layer being capable of reflecting the light;
- a second heat-insulating layer provided over the reflective layer;
- a second organic compound-containing layer provided over the second heat-insulating layer, and
- a third organic compound-containing layer provided over the reflective layer, wherein the first heat-insulating layer is spatially separated from the second heat-insulating layer.

2. The deposition substrate according to claim 1, wherein heat is conducted from the light absorption layer to the first organic compound-containing layer.

3. The deposition substrate according to claim 1, wherein the first organic compound-containing layer is configured to be evaporated by irradiating the light absorption layer with the light through the substrate and the first heat-insulating layer.

4. The deposition substrate according to claim 1, wherein, after irradiation with the light, the second organic compound-containing layer is configured to remain over the second heat-insulating layer.

5. The deposition substrate according to claim 1, wherein the first heat-insulating layer prevents heat from being conducted from the light absorption layer to the second region, and wherein the second heat-insulating layer prevents heat from being conducted from the reflective layer to the second organic compound-containing layer.

6. The deposition substrate according to claim 1, wherein an edge of the second heat-insulating layer is placed inside an edge of the reflective layer.

7. The deposition substrate according to claim 1, wherein the first region and the second region are in contact with each other.

8. The deposition substrate according to claim 1, wherein the first and second organic compound-containing layers include a material capable of forming an electro-luminescent layer.

9. The deposition substrate according to claim 1, wherein the first and second heat-insulating layers include silicon oxide.

10. The deposition substrate according to claim 1, wherein the first and second heat-insulating layers have a light transmittance of 60% or more to the light.

11. The deposition substrate according to claim 1, wherein the light absorption layer includes titanium or titanium nitride.

12. The deposition substrate according to claim 1, wherein the light absorption layer has a reflectance of 70% or less to the light.

13. The deposition substrate according to claim 1, wherein the reflective layer includes aluminum.

14. The deposition substrate according to claim 1, wherein the reflective layer has a reflectance of 85% or more to the light.

15. The deposition substrate according to claim 1, wherein a difference in reflectance between the reflective layer and the light absorption layer is 25% or more to the light.

16. A deposition substrate comprising:
a first region including:
- a first heat-insulating layer provided over a substrate capable of transmitting light, the first heat-insulating layer being capable of transmitting the light;
- a first light absorption layer provided over the first heat-insulating layer, the first light absorption layer being capable of absorbing the light; and
- a first organic compound-containing layer provided over the first light absorption layer; and a second region including:
- a reflective layer provided over the substrate, the reflective layer being capable of reflecting the light;
- a second heat-insulating layer provided over the reflective layer;
  - a second light absorption layer over the second heat-insulating layer;
- a second organic compound-containing layer provided over the second light absorption layer, and
- a third organic compound-containing layer provided over the reflective layer, wherein the first heat-insulating layer is spatially separated from the second heat-insulating layer.

17. The deposition substrate according to claim 16, wherein heat is conducted from the first light absorption layer to the first organic compound-containing layer.

18. The deposition substrate according to claim 16, wherein the first organic compound-containing layer is configured to be evaporated by irradiating the first light absorption layer with the light through the substrate and the first heat-insulating layer.

19. The deposition substrate according to claim 16, wherein, after irradiation with the light, the second organic compound-containing layer is configured to remain over the second heat-insulating layer.

20. The deposition substrate according to claim 16, wherein the first heat-insulating layer prevents heat from being conducted from the first light absorption layer to the second region, and wherein the second heat-insulating layer prevents heat from being conducted from the reflective layer to the second organic compound-containing layer.

21. The deposition substrate according to claim 16, wherein an edge of the second heat-insulating layer is placed inside an edge of the reflective layer.

22. The deposition substrate according to claim 16, wherein the first region and the second region are in contact with each other.

23. The deposition substrate according to claim 16, wherein the first and second organic compound-containing layers include a material capable of forming an electro-luminescent layer.

24. The deposition substrate according to claim 16, wherein the first and second heat-insulating layers include silicon oxide.

25. The deposition substrate according to claim 16, wherein the first and second heat-insulating layers have a light transmittance of 60% or more to the light.

26. The deposition substrate according to claim 16, wherein the first and second light absorption layers include titanium or titanium nitride.

27. The deposition substrate according to claim 16, wherein the first and second light absorption layers have a reflectance of 70% or less to the light.

28. The deposition substrate according to claim 16, wherein the reflective layer includes aluminum.

29. The deposition substrate according to claim 16, wherein the reflective layer has a reflectance of 85% or more to the light.

30. The deposition substrate according to claim 16, wherein a difference in reflectance between the reflective layer and the first light absorption layer is 25% or more to the light.

31. A deposition substrate comprising:
a first region including:
a first heat-insulating layer provided over a substrate capable of transmitting light, the first heat-insulating layer being capable of transmitting the light;
a light absorption layer provided over the first heat-insulating layer, the light absorption layer being capable of absorbing the light; and
a first organic compound-containing layer provided over the light absorption layer; and
a second region including:
a reflective layer provided over the substrate, the reflective layer being capable of reflecting the light;
a second heat-insulating layer provided over the reflective layer;
a third heat-insulating layer over the second heat-insulating layer;
a second organic compound-containing layer provided over the third heat-insulating layer, and
a third organic compound-containing layer provided over the reflective layer,
wherein the first heat-insulating layer is spatially separated from the second heat-insulating layer.

32. The deposition substrate according to claim 31, wherein heat is conducted from the light absorption layer to the first organic compound-containing layer.

33. The deposition substrate according to claim 31, wherein the first organic compound-containing layer is configured to be evaporated by irradiating the light absorption layer with the light through the substrate and the first heat-insulating layer.

34. The deposition substrate according to claim 31, wherein, after irradiation with the light, the second organic compound-containing layer is configured to remain over the third heat-insulating layer.

35. The deposition substrate according to claim 31, wherein the first heat-insulating layer prevents heat from being conducted from the light absorption layer to the second region, and
wherein the second and third heat-insulating layers prevent heat from being conducted from the reflective layer to the second organic compound-containing layer.

36. The deposition substrate according to claim 31, wherein an edge of the second heat-insulating layer is placed inside an edge of the reflective layer.

37. The deposition substrate according to claim 31, wherein the first region and the second region are in contact with each other.

38. The deposition substrate according to claim 31, wherein the first and second organic compound-containing layers include a material capable of forming an electro-luminescent layer.

39. The deposition substrate according to claim 31, wherein the first, second and third heat-insulating layers include silicon oxide.

40. The deposition substrate according to claim 31, wherein the first, second and third heat-insulating layers have a light transmittance of 60% or more to the light.

41. The deposition substrate according to claim 31, wherein the light absorption layer includes titanium or titanium nitride.

42. The deposition substrate according to claim 31, wherein the light absorption layer has a reflectance of 70% or less to the light.

43. The deposition substrate according to claim 31, wherein the reflective layer includes aluminum.

44. The deposition substrate according to claim 31, wherein the reflective layer has a reflectance of 85% or more to the light.

45. The deposition substrate according to claim 31, wherein a difference in reflectance between the reflective layer and the light absorption layer is 25% or more to the light.

46. The deposition substrate according to claim 1, wherein the third organic compound-containing layer is in contact with the first heat-insulating layer.

47. The deposition substrate according to claim 16 wherein the third organic compound-containing layer is in contact with the first heat-insulating layer.

48. The deposition substrate according to claim 31 wherein the third organic compound-containing layer is in contact with the first heat-insulating layer.

* * * * *

UNITED STATES PATENT AND TRADEMARK OFFICE
CERTIFICATE OF CORRECTION

PATENT NO. : 8,653,543 B2
APPLICATION NO. : 13/092272
DATED : February 18, 2014
INVENTOR(S) : Kohei Yokoyama and Hisao Ikeda Page 1 of 1

It is certified that error appears in the above-identified patent and that said Letters Patent is hereby corrected as shown below:

In the Specification:

Column 1, Line 17; Change "form a full-color" to --form full-color--.
Column 7, Line 52; Change "fainted" to --formed--.
Column 10, Line 10; Change "532 µm," to --532 nm,--.
Column 15, Line 5; Change "aimed" to --formed--.
Column 16, Line 64; Change "faun" to --form--.
Column 22, Line 2; Change "fondled" to --formed--.
Column 33, Line 34; Change "faulted" to --formed--.
Column 39, Line 63; Change "sec and" to --second--.

In the Claims:

Column 44, Line 37, Claim 47; Change "claim 16 wherein" to --claim 16, wherein--.
Column 44, Line 40, Claim 48; Change "claim 31 wherein" to --claim 31, wherein--.

Signed and Sealed this
Twenty-fourth Day of June, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,653,543 B2  
APPLICATION NO. : 13/092272  
DATED : February 18, 2014  
INVENTOR(S) : Kohei Yokoyama and Hisao Ikeda Page 1 of 1

It is certified that error appears in the above-identified patent and that said Letters Patent is hereby corrected as shown below:

In the Specification:

Column 38, Line 48; Change "of, a film" to --of a film--.

Signed and Sealed this
Twenty-second Day of July, 2014

Michelle K. Lee
*Deputy Director of the United States Patent and Trademark Office*